(12) United States Patent
Kim

(10) Patent No.: US 11,983,410 B2
(45) Date of Patent: May 14, 2024

(54) METHOD OPTIMIZING DQ CALIBRATION PATTERN FOR MEMORY DEVICE AND COMPUTING SYSTEM PERFORMING SAME

(71) Applicant: SAMSUNG ELECTRONICS CO., LTD., Suwon-si (KR)

(72) Inventor: Yongseob Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 260 days.

(21) Appl. No.: 17/530,226

(22) Filed: Nov. 18, 2021

(65) Prior Publication Data
US 2022/0269419 A1  Aug. 25, 2022

(30) Foreign Application Priority Data
Feb. 25, 2021  (KR) .................. 10-2021-0025491

(51) Int. Cl.
| G06F 3/06 | (2006.01) |
| G06F 13/16 | (2006.01) |
| G06N 20/00 | (2019.01) |
| G11C 7/10 | (2006.01) |
| G11C 7/20 | (2006.01) |

(52) U.S. Cl.
CPC .......... G06F 3/0611 (2013.01); G06F 3/0655 (2013.01); G06F 3/0673 (2013.01); G06F 13/1689 (2013.01); G06N 20/00 (2019.01); G11C 7/1078 (2013.01); G11C 7/20 (2013.01); G11C 2207/2254 (2013.01)

(58) Field of Classification Search
CPC ................................................. G06F 13/1689
See application file for complete search history.

(56) References Cited

U.S. PATENT DOCUMENTS

| 6,894,945 | B2 | 5/2005 | Sawada | |
| 8,305,837 | B2 | 11/2012 | Park | |
| 8,578,086 | B2 | 11/2013 | Chaudhuri et al. | |
| 9,026,725 | B2 | 5/2015 | Kostinsky et al. | |
| 9,177,623 | B2 | 11/2015 | Pandey et al. | |
| 9,218,575 | B2 | 12/2015 | Mozak et al. | |
| 9,330,734 | B2 | 5/2016 | Mozak et al. | |
| 9,971,975 | B2 | 5/2018 | Rao et al. | |
| 10,366,022 | B2 * | 7/2019 | Lee | G06F 13/126 |
| 10,659,215 | B1 | 5/2020 | Wang et al. | |
| 2005/0185498 | A1 * | 8/2005 | Keeth | G11C 7/222 |
| | | | | 365/232 |
| 2013/0346721 | A1 * | 12/2013 | Giovannini | G11C 29/56 |
| | | | | 711/167 |

(Continued)

*Primary Examiner* — Douglas King
(74) *Attorney, Agent, or Firm* — Fish & Richardson P.C.

(57) ABSTRACT

A method optimizing DQ calibration patterns for a memory device including data input/output (I/O) pins. The method includes; communicating a training command to the memory device, performing a training operation on each of the data I/O pins using a first training pattern having a first condition and a second training pattern having a second condition to generate a training operation result, wherein the first condition is characterized by adjacent data I/O pins among the data I/O pins providing data signals with different phases, and the second condition is characterized by adjacent data I/O pins providing data signals having a same phase, and aligning a data strobe signal with data signals provided from the data I/O pins in response the training operation result.

19 Claims, 23 Drawing Sheets

(56) References Cited

U.S. PATENT DOCUMENTS

2019/0004984 A1* 1/2019 Lee ................. G06F 13/126
2020/0119955 A1   4/2020 Ahn
2020/0133542 A1   4/2020 Kim et al.

* cited by examiner

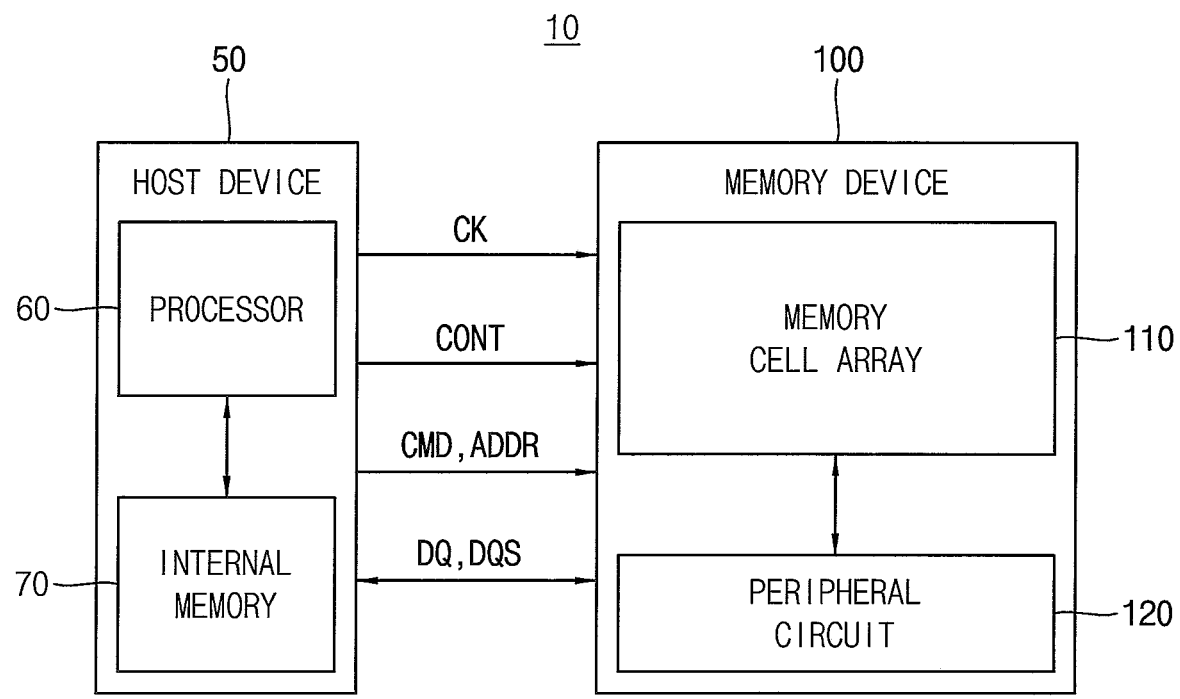

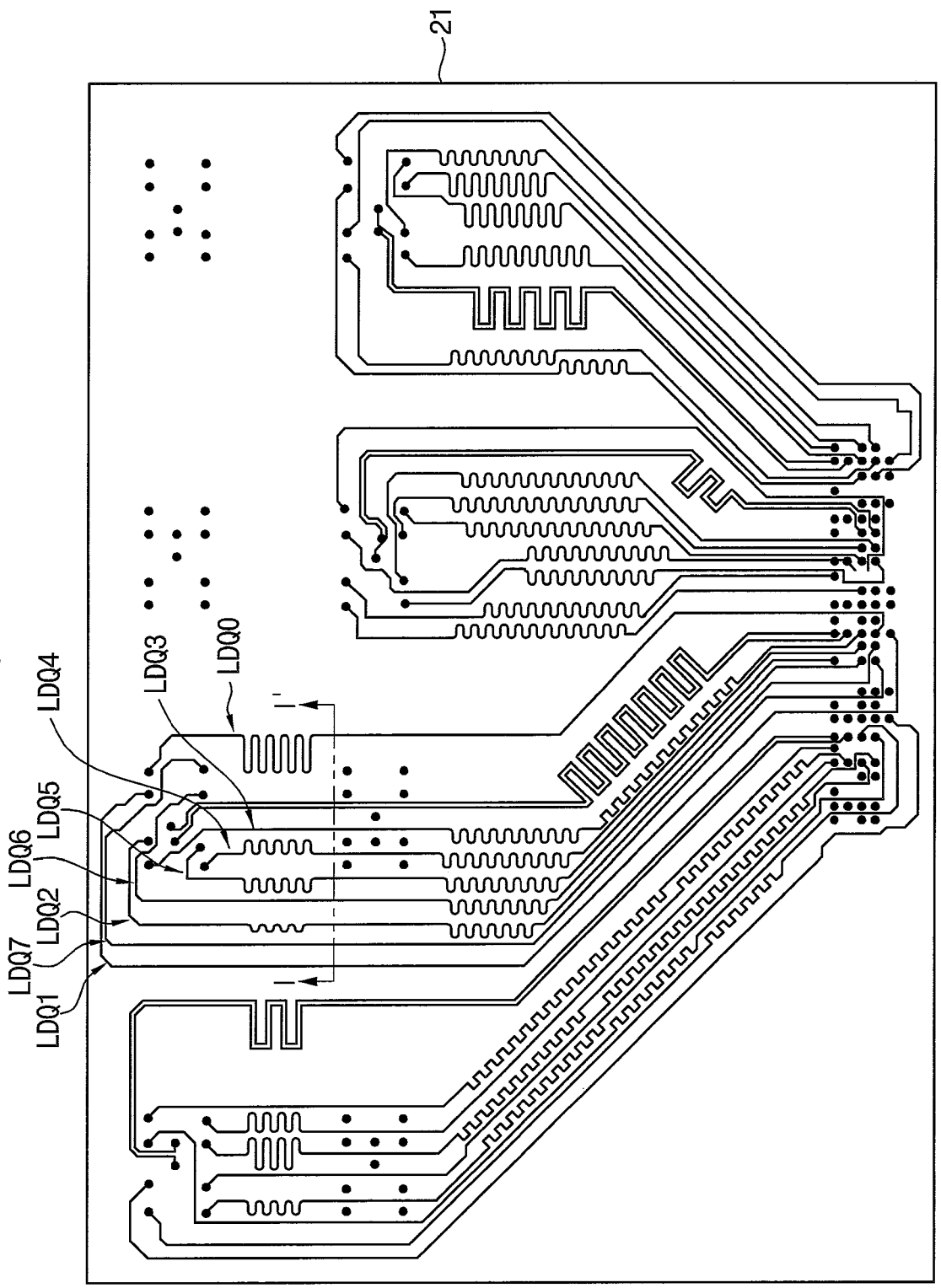

| | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|
| DQ0 | 1 | 0 | 1 | 0 | 1 | 0 | 1 | 0 | 0 | 1 | 0 | 1 | 0 | 1 | 0 | 1 |
| DQ1 | 0 | 1 | 0 | 1 | 0 | 1 | 0 | 1 | 1 | 0 | 1 | 0 | 1 | 0 | 1 | 0 |
| DQ2 | 0 | 1 | 0 | 1 | 0 | 1 | 0 | 1 | 1 | 0 | 1 | 0 | 1 | 0 | 1 | 0 |
| DQ3 | 0 | 1 | 0 | 1 | 0 | 1 | 0 | 1 | 1 | 0 | 1 | 0 | 1 | 0 | 1 | 0 |
| DQ4 | 0 | 1 | 0 | 1 | 0 | 1 | 0 | 1 | 1 | 0 | 1 | 0 | 1 | 0 | 1 | 0 |
| DQ5 | 0 | 1 | 0 | 1 | 0 | 1 | 0 | 1 | 1 | 0 | 1 | 0 | 1 | 0 | 1 | 0 |
| DQ6 | 0 | 1 | 0 | 1 | 0 | 1 | 0 | 1 | 1 | 0 | 1 | 0 | 1 | 0 | 1 | 0 |
| DQ7 | 0 | 1 | 0 | 1 | 0 | 1 | 0 | 1 | 1 | 0 | 1 | 0 | 1 | 0 | 1 | 0 |

FIG. 8A

| | | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|---|
| BS_ODD1_DQ0 | DQ0 | 0 | 1 | 0 | 1 | 0 | 1 | 0 | 1 | 1 | 0 | 1 | 0 | 1 | 0 | 1 | 0 |
| BS_ODD1_DQ1 | DQ1 | 1 | 0 | 1 | 0 | 1 | 0 | 1 | 0 | 0 | 1 | 0 | 1 | 0 | 1 | 0 | 1 |
| BS_ODD1_DQ2 | DQ2 | 0 | 1 | 0 | 1 | 0 | 1 | 0 | 1 | 1 | 0 | 1 | 0 | 1 | 0 | 1 | 0 |
| BS_ODD1_DQ3 | DQ3 | 0 | 1 | 0 | 1 | 0 | 1 | 0 | 1 | 1 | 0 | 1 | 0 | 1 | 0 | 1 | 0 |
| BS_ODD1_DQ4 | DQ4 | 0 | 1 | 0 | 1 | 0 | 1 | 0 | 1 | 1 | 0 | 1 | 0 | 1 | 0 | 1 | 0 |
| BS_ODD1_DQ5 | DQ5 | 0 | 1 | 0 | 1 | 0 | 1 | 0 | 1 | 1 | 0 | 1 | 0 | 1 | 0 | 1 | 0 |
| BS_ODD1_DQ6 | DQ6 | 0 | 1 | 0 | 1 | 0 | 1 | 0 | 1 | 1 | 0 | 1 | 0 | 1 | 0 | 1 | 0 |
| BS_ODD1_DQ7 | DQ7 | 0 | 1 | 0 | 1 | 0 | 1 | 0 | 1 | 1 | 0 | 1 | 0 | 1 | 0 | 1 | 0 |

TP_ODD_DQ1

FIG. 8B

| | | BS_ODD2_DQ0 | BS_ODD2_DQ1 | BS_ODD2_DQ2 | BS_ODD2_DQ3 | BS_ODD2_DQ4 | BS_ODD2_DQ5 | BS_ODD2_DQ6 | BS_ODD2_DQ7 |
|---|---|---|---|---|---|---|---|---|---|
| BL15 | | 0 | 0 | 1 | 0 | 0 | 0 | 0 | 0 |
| BL14 | | 1 | 1 | 0 | 1 | 1 | 1 | 1 | 1 |
| BL13 | | 0 | 0 | 1 | 0 | 0 | 0 | 0 | 0 |
| BL12 | | 1 | 1 | 0 | 1 | 1 | 1 | 1 | 1 |
| BL11 | | 0 | 0 | 1 | 0 | 0 | 0 | 0 | 0 |
| BL10 | | 1 | 1 | 0 | 1 | 1 | 1 | 1 | 1 |
| BL9 | TP_ODD_DQ2 | 0 | 0 | 1 | 0 | 0 | 0 | 0 | 0 |
| BL8 | | 1 | 1 | 0 | 1 | 1 | 1 | 1 | 1 |
| BL7 | | 1 | 1 | 0 | 1 | 1 | 1 | 1 | 1 |
| BL6 | | 0 | 0 | 1 | 0 | 0 | 0 | 0 | 0 |
| BL5 | | 1 | 1 | 0 | 1 | 1 | 1 | 1 | 1 |
| BL4 | | 0 | 0 | 1 | 0 | 0 | 0 | 0 | 0 |
| BL3 | | 1 | 1 | 0 | 1 | 1 | 1 | 1 | 1 |
| BL2 | | 0 | 0 | 1 | 0 | 0 | 0 | 0 | 0 |
| BL1 | | 1 | 1 | 0 | 1 | 1 | 1 | 1 | 1 |
| BL0 | | 0 | 0 | 1 | 0 | 0 | 0 | 0 | 0 |
| | | DQ0 | DQ1 | DQ2 | DQ3 | DQ4 | DQ5 | DQ6 | DQ7 |

| | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|
| DQ0 | 0 | 1 | 0 | 1 | 0 | 1 | 0 | 1 | 1 | 0 | 1 | 0 | 1 | 0 | 1 | 0 |
| DQ1 | 0 | 1 | 0 | 1 | 0 | 1 | 0 | 1 | 1 | 0 | 1 | 0 | 1 | 0 | 1 | 0 |
| DQ2 | 0 | 1 | 0 | 1 | 0 | 1 | 0 | 1 | 1 | 0 | 1 | 0 | 1 | 0 | 1 | 0 |
| DQ3 | 1 | 0 | 1 | 0 | 1 | 0 | 1 | 0 | 0 | 1 | 0 | 1 | 0 | 1 | 0 | 1 |
| DQ4 | 0 | 1 | 0 | 1 | 0 | 1 | 0 | 1 | 1 | 0 | 1 | 0 | 1 | 0 | 1 | 0 |
| DQ5 | 0 | 1 | 0 | 1 | 0 | 1 | 0 | 1 | 1 | 0 | 1 | 0 | 1 | 0 | 1 | 0 |
| DQ6 | 0 | 1 | 0 | 1 | 0 | 1 | 0 | 1 | 1 | 0 | 1 | 0 | 1 | 0 | 1 | 0 |
| DQ7 | 0 | 1 | 0 | 1 | 0 | 1 | 0 | 1 | 1 | 0 | 1 | 0 | 1 | 0 | 1 | 0 |

FIG. 8D

TP_ODD_DQ4

| | BS_ODD4_DQ0 | BS_ODD4_DQ1 | BS_ODD4_DQ2 | BS_ODD4_DQ3 | BS_ODD4_DQ4 | BS_ODD4_DQ5 | BS_ODD4_DQ6 | BS_ODD4_DQ7 |
|---|---|---|---|---|---|---|---|---|
| BL15 | 0 | 0 | 0 | 0 | 1 | 0 | 0 | 0 |
| BL14 | 1 | 1 | 1 | 1 | 0 | 1 | 1 | 1 |
| BL13 | 0 | 0 | 0 | 0 | 1 | 0 | 0 | 0 |
| BL12 | 1 | 1 | 1 | 1 | 0 | 1 | 1 | 1 |
| BL11 | 0 | 0 | 0 | 0 | 1 | 0 | 0 | 0 |
| BL10 | 1 | 1 | 1 | 1 | 0 | 1 | 1 | 1 |
| BL9 | 0 | 0 | 0 | 0 | 1 | 0 | 0 | 0 |
| BL8 | 1 | 1 | 1 | 1 | 0 | 1 | 1 | 1 |
| BL7 | 1 | 1 | 1 | 1 | 0 | 1 | 1 | 1 |
| BL6 | 0 | 0 | 0 | 0 | 1 | 0 | 0 | 0 |
| BL5 | 1 | 1 | 1 | 1 | 0 | 1 | 1 | 1 |
| BL4 | 0 | 0 | 0 | 0 | 1 | 0 | 0 | 0 |
| BL3 | 1 | 1 | 1 | 1 | 0 | 1 | 1 | 1 |
| BL2 | 0 | 0 | 0 | 0 | 1 | 0 | 0 | 0 |
| BL1 | 1 | 1 | 1 | 1 | 0 | 1 | 1 | 1 |
| BL0 | 0 | 0 | 0 | 0 | 1 | 0 | 0 | 0 |
| | DQ0 | DQ1 | DQ2 | DQ3 | DQ4 | DQ5 | DQ6 | DQ7 |

FIG. 8E

TP_ODD_DQ5

| | | BS_ODD5_DQ0 | BS_ODD5_DQ1 | BS_ODD5_DQ2 | BS_ODD5_DQ3 | BS_ODD5_DQ4 | BS_ODD5_DQ5 | BS_ODD5_DQ6 | BS_ODD5_DQ7 |
|---|---|---|---|---|---|---|---|---|---|
| | BL15 | 0 | 0 | 0 | 0 | 0 | 1 | 0 | 0 |
| | BL14 | 1 | 1 | 1 | 1 | 1 | 0 | 1 | 1 |
| | BL13 | 0 | 0 | 0 | 0 | 0 | 1 | 0 | 0 |
| | BL12 | 1 | 1 | 1 | 1 | 1 | 0 | 1 | 1 |
| | BL11 | 0 | 0 | 0 | 0 | 0 | 1 | 0 | 0 |
| | BL10 | 1 | 1 | 1 | 1 | 1 | 0 | 1 | 1 |
| | BL9 | 0 | 0 | 0 | 0 | 0 | 1 | 0 | 0 |
| | BL8 | 1 | 1 | 1 | 1 | 1 | 0 | 1 | 1 |
| | BL7 | 1 | 1 | 1 | 1 | 1 | 0 | 1 | 1 |
| | BL6 | 0 | 0 | 0 | 0 | 0 | 1 | 0 | 0 |
| | BL5 | 1 | 1 | 1 | 1 | 1 | 0 | 1 | 1 |
| | BL4 | 0 | 0 | 0 | 0 | 0 | 1 | 0 | 0 |
| | BL3 | 1 | 1 | 1 | 1 | 1 | 0 | 1 | 1 |
| | BL2 | 0 | 0 | 0 | 0 | 0 | 1 | 0 | 0 |
| | BL1 | 1 | 1 | 1 | 1 | 1 | 0 | 1 | 1 |
| | BL0 | 0 | 0 | 0 | 0 | 0 | 1 | 0 | 0 |
| | | DQ0 | DQ1 | DQ2 | DQ3 | DQ4 | DQ5 | DQ6 | DQ7 |

FIG. 8F

| | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|
| DQ0 | 0 | 1 | 0 | 1 | 0 | 1 | 0 | 1 | 1 | 0 | 1 | 0 | 1 | 0 | 1 | 0 |
| DQ1 | 0 | 1 | 0 | 1 | 0 | 1 | 0 | 1 | 1 | 0 | 1 | 0 | 1 | 0 | 1 | 0 |
| DQ2 | 0 | 1 | 0 | 1 | 0 | 1 | 0 | 1 | 1 | 0 | 1 | 0 | 1 | 0 | 1 | 0 |
| DQ3 | 0 | 1 | 0 | 1 | 0 | 1 | 0 | 1 | 1 | 0 | 1 | 0 | 1 | 0 | 1 | 0 |
| DQ4 | 0 | 1 | 0 | 1 | 0 | 1 | 0 | 1 | 1 | 0 | 1 | 0 | 1 | 0 | 1 | 0 |
| DQ5 | 0 | 1 | 0 | 1 | 0 | 1 | 0 | 1 | 1 | 0 | 1 | 0 | 1 | 0 | 1 | 0 |
| DQ6 | 1 | 0 | 1 | 0 | 1 | 0 | 1 | 0 | 0 | 1 | 0 | 1 | 0 | 1 | 0 | 1 |
| DQ7 | 0 | 1 | 0 | 1 | 0 | 1 | 0 | 1 | 1 | 0 | 1 | 0 | 1 | 0 | 1 | 0 |

TP_ODD_DQ6

BS_ODD6_DQ0, BS_ODD6_DQ1, BS_ODD6_DQ2, BS_ODD6_DQ3, BS_ODD6_DQ4, BS_ODD6_DQ5, BS_ODD6_DQ6, BS_ODD6_DQ7

FIG. 8G

TP_ODD_DQ7

| | BL0 | BL1 | BL2 | BL3 | BL4 | BL5 | BL6 | BL7 | BL8 | BL9 | BL10 | BL11 | BL12 | BL13 | BL14 | BL15 |
|---|---|---|---|---|---|---|---|---|---|---|---|---|---|---|---|---|
| DQ0 | 0 | 1 | 0 | 1 | 0 | 1 | 0 | 1 | 1 | 0 | 1 | 0 | 1 | 0 | 1 | 0 |
| DQ1 | 0 | 1 | 0 | 1 | 0 | 1 | 0 | 1 | 1 | 0 | 1 | 0 | 1 | 0 | 1 | 0 |
| DQ2 | 0 | 1 | 0 | 1 | 0 | 1 | 0 | 1 | 1 | 0 | 1 | 0 | 1 | 0 | 1 | 0 |
| DQ3 | 0 | 1 | 0 | 1 | 0 | 1 | 0 | 1 | 1 | 0 | 1 | 0 | 1 | 0 | 1 | 0 |
| DQ4 | 0 | 1 | 0 | 1 | 0 | 1 | 0 | 1 | 1 | 0 | 1 | 0 | 1 | 0 | 1 | 0 |
| DQ5 | 0 | 1 | 0 | 1 | 0 | 1 | 0 | 1 | 1 | 0 | 1 | 0 | 1 | 0 | 1 | 0 |
| DQ6 | 0 | 1 | 0 | 1 | 0 | 1 | 0 | 1 | 1 | 0 | 1 | 0 | 1 | 0 | 1 | 0 |
| DQ7 | 1 | 0 | 1 | 0 | 1 | 0 | 1 | 0 | 0 | 1 | 0 | 1 | 0 | 1 | 0 | 1 |

↑ BS_ODD7_DQ0 ... BS_ODD7_DQ7 (columns BL8–BL15)

METHOD OPTIMIZING DQ CALIBRATION PATTERN FOR MEMORY DEVICE AND COMPUTING SYSTEM PERFORMING SAME

CROSS-REFERENCE TO RELATED APPLICATION

This application claims priority under 35 USC § 119 to Korean Patent Application No. 10-2021-0025491 filed on Feb. 25, 2021 in the Korean Intellectual Property Office (KIPO), the subject matter of which is hereby incorporated by reference.

BACKGROUND

1. Technical Field

The inventive concept relates generally to semiconductor integrated circuits (ICs), and more particularly to methods optimizing DQ calibration patterns for memory devices and computing system performing methods optimizing the DQ calibration patterns.

2. Description of the Related Art

The term system-on-chip (or SoC) refers to a processing system that integrates various functional blocks (e.g., a central processing unit, a memory, an interface unit, a digital signal processing unit, an analog signal processing unit, etc.) into a single IC or a small number of ICs in order to efficiently implement an electronic system, such as a computer system. A SoC may be interoperable with different types of memory devices manufactured by different vendors with different densities using different fabrication processes. Accordingly, when data is read from and/or written to the memory device, a DQ calibration operation (e.g., a DQS/DQ centering operation) should be performed to ensure an optimal centering (or opening) of a read/write eye.

SUMMARY

Embodiments of the inventive concept provide methods of optimizing DQ calibration patterns for a memory device capable of ensuring an optimal eye opening for each DQ. Embodiments of the inventive concept provide computing systems capable of performing the methods optimizing the DQ calibration patterns.

In some embodiments, a method optimizing DQ calibration patterns for a memory device including data input/output (I/O) pins may include; communicating a training command to the memory device, performing a training operation on each of the data I/O pins using a first training pattern having a first condition and a second training pattern having a second condition to generate a training operation result, wherein the first condition is characterized by adjacent data I/O pins among the data I/O pins providing data signals with different phases, and the second condition is characterized by adjacent data I/O pins providing data signals having a same phase, and aligning a data strobe signal with data signals provided from the data I/O pins in response the training operation result.

In some embodiments, a computing system may include; a first memory device including data input/output (I/O) pins, and a host device configured to communicate a training command to the first memory device, perform a training operation on each of the data I/O pins using a first training pattern having a first condition and a second training pattern having a second condition to generate a training operation result, and align a data strobe signal with data signals provided by the data I/O pins in response to the training operation result, wherein the first condition is characterized by adjacent data I/O pins among the data I/O pins providing data signals with different phases, and the second condition is characterized by adjacent data I/O pins providing data signals having a same phase.

In some embodiments, a method optimizing DQ calibration patterns for a memory device including data input/output (I/O) pins and a data strobe pin may include; entering a training mode upon power on of the memory device, generating a training command in the training mode, communicating the training command to the memory device, performing a first training operation on a first data I/O pin among the data I/O pins using a first training pattern having a first condition and a second training pattern having a second condition to generate a first training operation result, performing a second training operation on a second data I/O pin among the data I/O pins using a third training pattern having the first condition and a fourth training pattern having the second condition to generate a second training operation result, obtaining an optimal value based on the first training operation result and the second training operation result, and aligning centers data signals provided by the I/O data pins with an edge of a data strobe signal provided by the data strobe pin in response to the optimal value. The first condition is characterized by adjacent data I/O pins among the data I/O pins providing data signals with different phases, and the second condition is characterized by adjacent data I/O pins providing data signals having a same phase, the first training pattern includes first bit sequences provided by the data I/O pins, such that each of the first bit sequences corresponds to a respective one of the data I/O pins, a first bit sequence corresponding to the first data I/O pin is different from first bit sequences corresponding to remaining data I/O pins among the data I/O ping, other than the first data I/O pin, the second training pattern includes second bit sequences provided by the data I/O pins, such that each of the second bit sequences corresponds to a respective one of the data I/O pins, and the second bit sequences are equal to one another.

BRIEF DESCRIPTION OF THE DRAWINGS

The making and use of the inventive concept may be better understood upon consideration of the following written description together with the accompanying drawings, in which:

FIG. 3 is a block diagram illustrating a computing system according to embodiments of the inventive concept;

FIGS. 5A and 5B are layout diagrams further illustrating a computing system according to embodiments of the inventive concept;

FIGS. 7A, 7B, 8A, 8B, 8C, 8D, 8E, 8F and 8G are respective, conceptual diagrams further illustrating the training operation of FIG. 6;

DETAILED DESCRIPTION

Throughout the written description and drawings, like reference numbers and labels are used to denote like or similar elements, features or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
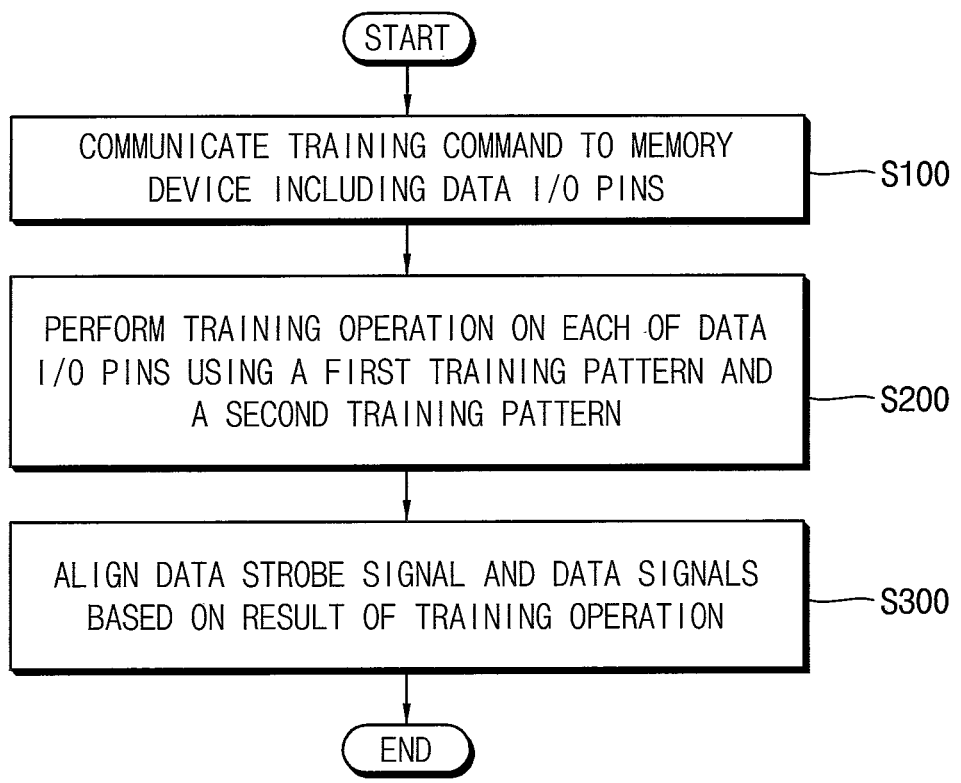
FIG. 1 is a flowchart illustrating a method of optimizing DQ calibration patterns for a memory device according to embodiments of the inventive concept.
Figure 2A:
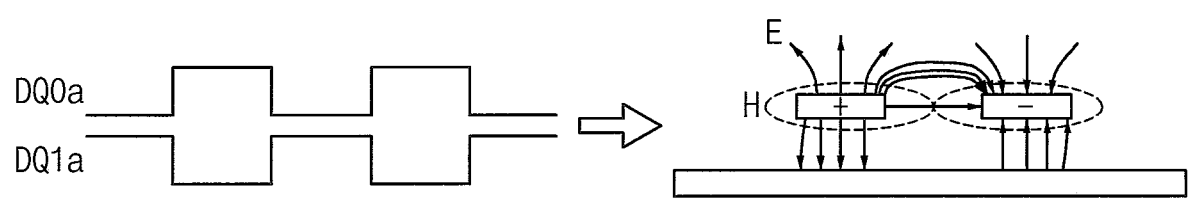
FIGS. 2A and 2B are conceptual diagrams illustrating method(s) of optimizing DQ calibration patterns for a memory device according to embodiments of the inventive concept.
Figure 2B:
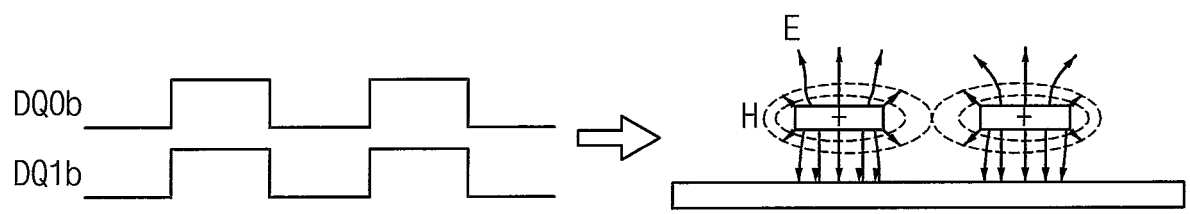

FIG. 1 is a flowchart illustrating a method of optimizing DQ calibration patterns for memory devices according to embodiments of the inventive concept, and FIGS. 2A and 2B are conceptual diagrams further illustrating the method of optimizing DQ calibration patterns.

Referring to FIG. 1, a method optimizing DQ calibration patterns for a memory device may be performed by a host device connected to the memory device, and configured to control operation of the memory device. The memory device may include a plurality of data input/output (I/O) pins (or "DQ pins"), as well as a data strobe pin (or "a DQS pin"). In this context, one or more DQ calibration patterns may be used to calibrate (e.g., compensate or correct) the communication (e.g., transmission or reception) of data signals via the DQ pins and the DQS pin. Such DQ calibration patterns may be referred to as training patterns. Exemplary computing system including a memory device and a host device will be described hereafter in some additional detail in relation to the embodiments illustrated in FIGS. 3, 4, 5A and 5B.

In the method optimizing DQ calibration patterns for a memory device according to embodiments of the inventive concept, a training command may be transmitted from the host device to the memory device (S100). In some embodiments, the host device may enter a training mode, generate the training command while operating in the training mode, and provide the training command to the memory device.

In some embodiments (see, e.g., the method of FIG. 12), the training command may be generated and provided to the memory device upon an initial power-up of the memory device. Alternately, in other embodiments (see, e.g., the method of FIG. 13), while the memory device is operating normally (e.g. while being driven in real-time, or during runtime, or when activated online), the training command may be generated and provided to the memory device in response to a determination made in relation to an environmental sensor indicating that current environmental conditions have exceeded a predetermined environmental range.

Upon receiving the training command, the memory device may perform a training operation on each of the data I/O pins using a first training pattern (e.g., a training pattern related to a first condition) and a second training pattern (e.g., a training pattern related to a second condition) (S200). In this regard, the first condition may be one operating mode in which output data signals provided at adjacent data I/O pins among the data I/O pins have different phases, while the second condition may be another operating mode in which output data signals provided at adjacent data I/O pins among the data I/O pins have the same phase. That is, under the first condition, adjacent data I/O pins are configured to output data signals having different phases, and under the second condition the adjacent data I/O pins are configured to output data signals having the same phase. In some embodiments, the "different phases" defined by the first condition may be opposite phases. One example of the method step S200 of FIG. 1 will be described hereafter in some additional detail with reference to FIG. 6.

FIG. 2A illustrates one example in which adjacent data I/O pins provide output data signals in response to the first training pattern. In this regard, the first condition defining the first training pattern may be referred to as an "odd condition" or an "odd mode."

Thus, a signal waveform portion of FIG. 2A shows two data signals DQ0$a$ and DQ1$a$ having opposite phases being output by adjacent data I/O pins, and a signal line portion of FIG. 2A shows electric fields 'E' and magnetic fields 'H' generated in response to the two data signals DQ0$a$ and DQ1$a$, as transmitted through two signal transmission lines. Here, one signal transmission line is marked "+" (e.g., the signal transmission line through which the data signal DQ0$a$ is transmitted), and the other signal transmission line is marked "−" (e.g., the signal transmission line through which the data signal DQ1$a$ is transmitted). As a result of the adjacent, oppositely-phased electromagnetic fields formed by the signal transmission lines of FIG. 2A, data signals being communicated by the signal transmission lines of FIG. 2A may be communicated (transmitted and/or received) relatively quickly.

FIG. 2B illustrates another example in which adjacent data I/O pins provide output data signals in response to the second training pattern. In this regard, the second condition defining the second training pattern may be referred to as an "even condition" or an "even mode."

Thus, a signal waveform portion of FIG. 2B shows two data signals DQ0$b$ and DQ1$b$ having the same phase being output by adjacent data I/O pins, and a signal line portion of FIG. 2B shows electric fields 'E' and magnetic fields 'H' generated in response to the two data signals DQ0$b$ and DQ1$b$, as transmitted through the two signal transmission lines. Here, both signal transmission lines are marked "+". As a result of the adjacent, same-phased electromagnetic fields formed by the signal transmission lines of FIG. 2B, data signals may be communicated relatively slowly, as compared with the approach illustrated in FIG. 2A.

From the foregoing, it should be apparent that electromagnetic fields associated with adjacent signal transmission lines (or other conductive elements, such as pins) may interact with one another, and that such interaction may influence the respective impedances and/or propagation delays of the signal transmission lines. That is, consistent with the example of FIG. 2A, data signals DQ0$a$ and DQ1$a$ having opposite phases and output by adjacent data I/O pins in response to the first training pattern may be communicated (e.g., transmitted and/or received) with the host during a first time interval, and consistent with the example of FIG. 2B, data signals DQ0b and DQ1b having the same phase and output by adjacent data I/O pins in response to the second training pattern may be communicated (e.g., transmitted and/or received) with the host during a second time interval longer than the first time interval. Accordingly, a truly competent training operation should take into consideration different operating conditions, and therefore should include different training patterns.

Referring to FIG. 1, based a result of the training operation, a data strobe signal (DQS) provided from the DQS pin and data signals (DQ) provided from the data I/O pins may be properly aligned (S300). For example, the centers of the data signals may be aligned with an edge of the data strobe signal. This aligning of centers of the data signals with an edge of the data strobe signal is one example of a DQS/DQ centering operation. One example of the method step S300 of FIG. 1 will be described in some additional detail hereafter with reference to FIG. 9.

In the method of optimizing DQ calibration patterns for memory devices according to embodiments of the inventive concept, the data strobe signal and the plurality of data signals may be aligned using a plurality of training patterns. Hence, for example, the training operation may be performed for each of the data I/O pins providing the data signals using both a first training pattern (e.g., operating in accordance with the odd mode) and a second training pattern (e.g., operating in accordance with the even mode). Since data I/O pin designs and signal transmission line layouts differ by product, it is very difficult to accurately define a training operation and related training patterns in advance. However, when multiple training patterns are used, consistent with embodiments of the inventive concept, a training operation and/or a signal alignment operation may be performed under conditions approximating a worst-case condition for each data I/O pin. Accordingly, skew between the data strobe signal and the data signals may be efficiently defined, an optimal eye opening may be ensured, and performance of the memory device may be improved.

FIG. 3 is a block diagram illustrating a computing system 10 according to embodiments of the inventive concept.

Referring to FIG. 3, the computing system 10 generally includes a host device 50 and a memory device 100.

In some embodiments, the computing system 10 may be one of various electronic devices and/or systems such as a personal computer (PC), a server computer, a data center, a workstation, a mobile phone, a smart phone, a tablet computer, a laptop computer, a personal digital assistant (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The host device 50 may control overall operation of the computing system 10. For example, the host device 50 may provide a clock signal CK and a control signal CONT to the memory device 100, may provide a command CMD and an address ADDR to the memory device 100, and may exchange a plurality of data signals DQ and a data strobe signal DQS with the memory device 100.

The host device 50 may include a memory controller that controls an operation of the memory device 100, or may function as the memory controller. For example, the host device 50 may control data write/read operations performed by the memory device 100.

The host device 50 may include at least one processor 60 and an internal memory 70.

The processor 60 may operate in accordance with an operating system (OS). The OS may include a file system for file management and a device driver for controlling peripheral devices at the OS level. In addition, the processor 60 may execute a plurality of applications that provide various services. For example, the processor 60 may execute a video application, a game application, a web browser application, etc. Furthermore, the processor 60 may include at least one of various processing units such as a central processing unit (CPU), a microprocessor, an application processor (AP), or the like.

The internal memory 70 may store codes, instructions and/or data that are executed, processed and/or handled by the processor 60. For example, the internal memory 70 may store a result of the training operation and/or a result of the signal alignment operation described in relation to FIG. 1. For example, the internal memory 70 may include at least one volatile memory device, such as a static random access memory (SRAM), or the like.

In some embodiments, the internal memory 70 may additionally store booting code controlling the execution of an initialization operation and/or booting operation for the memory device 100. For example, the internal memory 70 may further include at least one nonvolatile memory device capable of retaining stored data in the absence of applied power.

In some embodiments, the host device 50 may be a system-on-chip (SOC), and may further include various functional blocks (e.g., an interface unit, a digital signal processor, an analog signal processor, etc.).

The memory device 100 may operate in response to the clock signal CK, one or more control signal(s) CONT, command(s) CMD and/or address(es) ADDR, and may communicate data signals DQ and a data strobe signal DQS with the host device 50. For example, in response to requests from the host device 50, the memory device 100 may store (e.g., write) data provided from the host device 50, or may retrieve (e.g., read) stored data for the host device 50. The data strobe signal DQS may be generated in response to the clock signal CK.

The memory device 100 may include a memory dell array 110 and a peripheral circuit 120.

The memory cell array 110 may include memory cells configured to store variously defined data. For example, the memory cell array 110 may include (e.g., may be divided into) ranks of memory cells. The peripheral circuit 120 may control access to the memory cell array 110.

In some embodiments, the memory device 100 may operate synchronously with the clock signal CK provided from the host device 50, and may include at least one volatile memory device. One example of the memory device 100 will be described in some additional detail hereafter with reference to FIG. 4.

The computing system 10 may further include a power supply device capable of suppling power supply voltage(s) to the host device 50 and/or the memory device 100. Here, the power supply device may include a power management integrated circuit (PMIC).

An exemplary operation of the computing system 10 during execution of the method of optimizing DQ calibration patterns according to embodiments of the inventive concept will now be described.

Referring to FIGS. 1 and 3, the host device 50 may transmit the training command to the memory device 100 (S100). That is, the host device 50 may perform a training operation on each of a plurality of data I/O pins (e.g., each of data I/O pins PDQ02, PDQ12, PDQ22, PDQ32, PDQ42, PDQ52, PDQ62 and PDQ72 shown in FIG. 5A) included in the memory device 100 using a first training pattern (e.g., training pattern TP_ODD_DQ0 of FIG. 7A) and a second training pattern (e.g., training pattern TP_EVEN_DQ0 of FIG. 7B) (S200).

In response to a result of the training operation, the host device 50 may align the data strobe signal DQS provided by a data strobe pin (e.g., a data strobe pin PDQS2 in FIG. 5A) and the plurality of data signals DQ provided by the data I/O pins (S300). In other words, the method of FIG. 1 may be performed by the host device 50 in relation to the memory device 100. In some embodiments, the instructions controlling the execution of the method of FIG. 1 may be in the internal memory 70 of the host 50.

Figure 4:
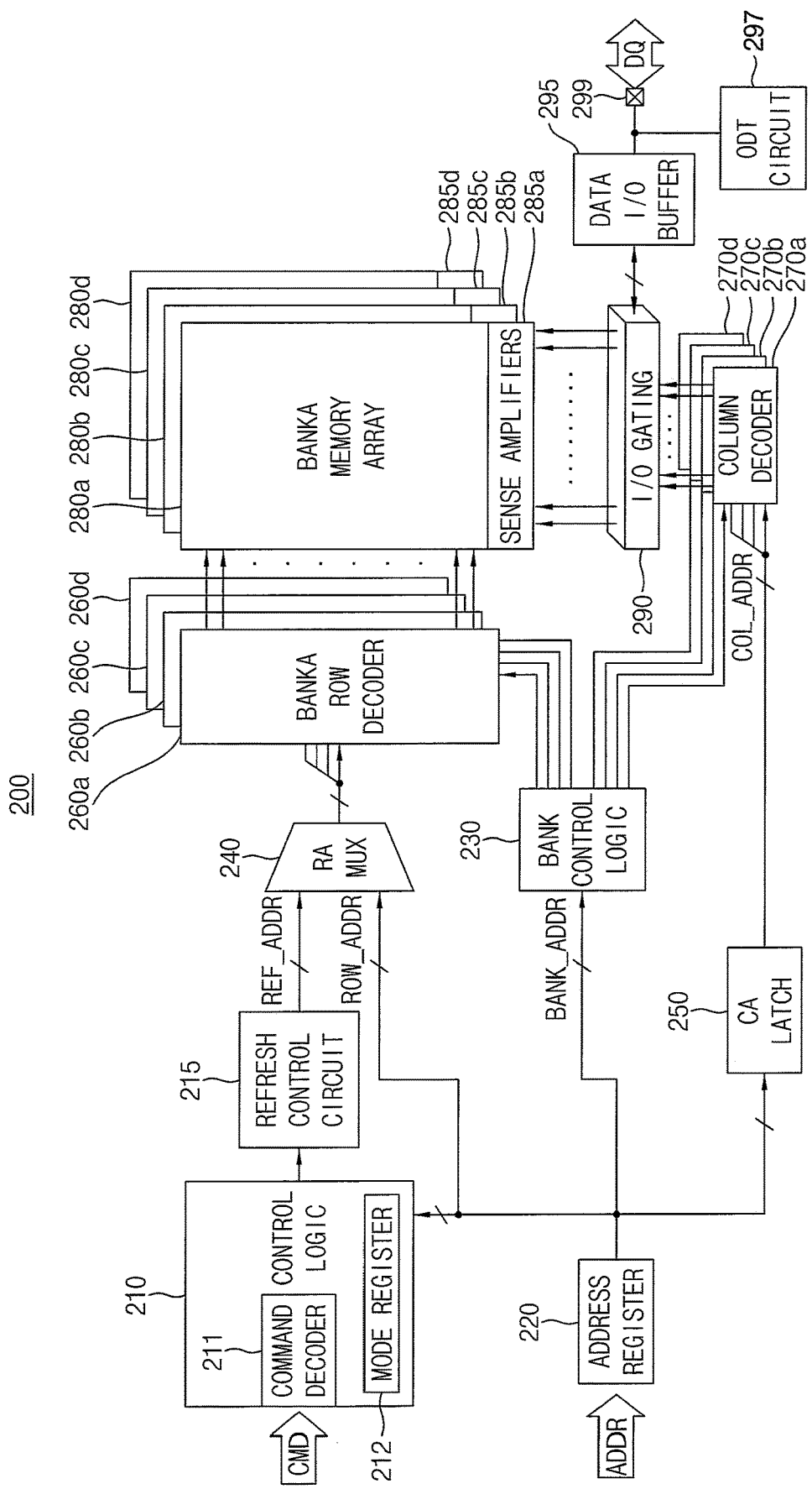
FIG. 4 is a block diagram illustrating in one example a memory device that may be included in computing systems according to embodiments of the inventive concept.

FIG. 4 is a block diagram illustrating a memory device 200 that may be included in the computing system 10 of FIG. 3.

Referring to FIG. 4, the memory device 200 may include a control logic circuit 210, a refresh control circuit 215, an address register 220, a bank control logic circuit 230, a row address multiplexer 240, a column address latch 250, a row decoder, a column decoder, a memory cell array, a sense amplifier unit (e.g., sense amplifier), an input/output (I/O) gating circuit 290, a data I/O buffer 295, an on-die termination (ODT) circuit 297 and a data I/O pin (or pad) 299. It is understood that one or more other example embodiments are not limited to the specific combination and number of components illustrated and described in FIG. 4.

In some embodiments, the memory device 200 may be the memory device 100 in FIG. 2 and may be, by way of example, a volatile memory device. For example, the memory device 200 may be one of; a dynamic random access memory (DRAM), a mobile DRAM, a dual data rate (DDR) DRAM, a low power DDR (LPDDR) DRAM, a graphic DDR (GDDR) DRAM, or the like.

The memory cell array include memory cells. The memory cell array may include a multiple bank arrays (e.g., first through fourth bank arrays 280a, 280b, 280c and 280d). The row decoder may include multiple bank row decoders (e.g., first through fourth bank row decoders 260a, 260b, 260c and 260d respectively connected to the first through fourth bank arrays 280a, 280b, 280c and 280d). The column decoder may include multiple bank column decoders (e.g., first through fourth bank column decoders 270a, 270b, 270c and 270d respectively connected to the first through fourth bank arrays 280a, 280b, 280c and 280d). The sense amplifier unit may include multiple bank sense amplifiers (e.g., first through fourth bank sense amplifiers 285a, 285b, 285c and 285d respectively connected to the first through fourth bank arrays 280a, 280b, 280c and 280d).

The first through fourth bank arrays 280a to 280d, the first through fourth bank row decoders 260a to 260d, the first through fourth bank column decoders 270a to 270d, and the first through fourth bank sense amplifiers 285a to 285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 4 illustrates the memory device 200 including four banks, it is understood that other embodiments are not limited thereto, and the memory device 200 may include any reasonable number of banks. It is further understood that while the components illustrated in FIG. 4 in quantities of four have a one-to-one correspondence with each other, other embodiments are not limited thereto. For example, there could be more or fewer decoders, sensors etc.

The address register 220 may receive an address ADDR including a bank address BANK_ADDR, a row address ROW_ADDR and a column address COL_ADDR from a memory controller (or from a host device). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a to 260d corresponding to the received bank address BANK_ADDR may be activated in response to the bank control signals generated by the bank control logic circuit 230, and one of the first through fourth bank column decoders 270a to 270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a to 260d.

The activated one of the first through fourth bank row decoders 260a to 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a to 270d.

The activated one of the first through fourth bank column decoders 270a to 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not illustrated in detail, the I/O gating circuit 290 may include an input data mask logic, read data latches for storing data output from the first through fourth bank arrays 280a to 280d, and write drivers for writing data to the first through fourth bank arrays 280a to 280d.

Data to be read from one of the first through fourth bank arrays 280a to 280d may be sensed by a sense amplifier coupled to the corresponding bank array, and may be stored in the read data latches. The data stored in the read data latches may be provided to the memory controller via the data I/O buffer 295 and the data I/O pin 299. Data received via the data I/O pin 299 that is to be written to one of the first through fourth bank arrays 280a-280d may be provided from the memory controller to the data I/O buffer 295. The data received via the data I/O pin 299 and provided to the data I/O buffer 295 may be written to the corresponding bank array via the write drivers in the I/O gating circuit 290.

The control logic circuit 210 may control operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CK) and a clock enable signal (e.g., /CKE) for operating the memory device 200 in a synchronous manner.

The ODT circuit 297 may be connected to the data I/O pin 299 and the data I/O buffer 295. When the ODT circuit 297 is enabled, an ODT operation may be performed. The ODT operation may reduce (and/or prevent) a signal from being reflected by using a termination resistor so as to improve signal integrity.

Components, other than those of the memory cell array 110 in FIG. 4 may correspond to the peripheral circuit 120 in FIG. 3. For convenience of illustration, only one data I/O pin 299 is illustrated in FIG. 4. However, as will be described in relation to FIGS. 5A and 5B hereafter, the memory device 200 may include a plurality of data I/O pins.

Figure 5A:
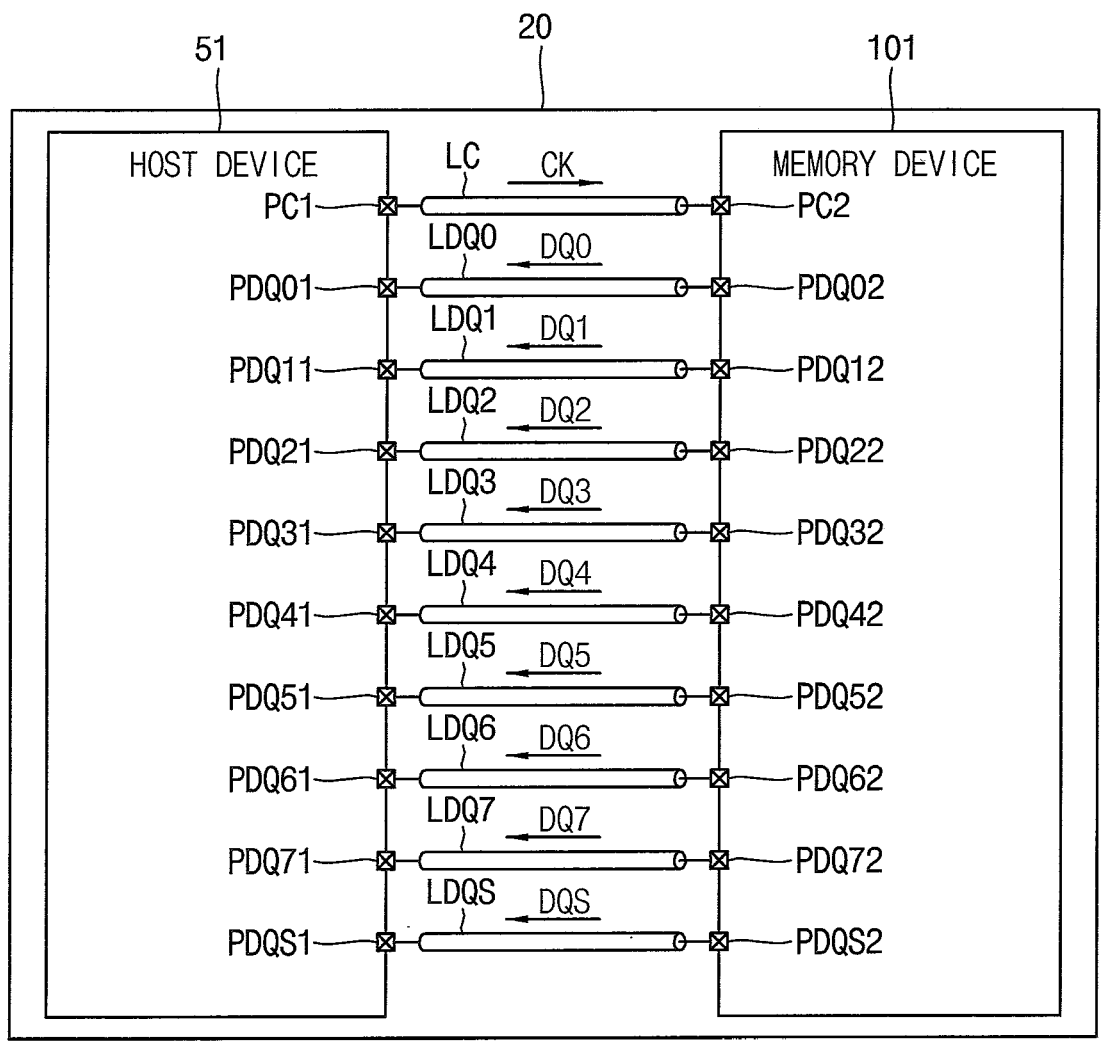

FIG. 5A is a block diagram and FIG. 5B is a layout diagram further illustrating aspects of a computing system according to embodiments of the inventive concept.

Referring to FIG. 5A, a computing system including a host device 51 and memory device 51 may be implemented on a substrate 20 (e.g., a printed circuit board or PCB). For convenience of illustration, only exemplary, selected signal transmission connections between the host device 51 and the memory device 101 are illustrated in FIG. 5A.

For example, the host device 51 may include a clock pin PC1 providing a clock signal CK, data I/O pins PDQ01, PDQ11, PDQ21, PDQ31, PDQ41, PDQ51, PDQ61 and PDQ71 communicating data signals DQ0, DQ1, DQ2, DQ3, DQ4, DQ5, DQ6 and DQ7, and a data strobe pin PDQS1 receiving a data strobe signal DQ5. Although not shown in FIG. 5A, the host device 51 may further include transmitters, receivers and a physical layer variously connected to the pins PC1, PDQ01, PDQ11, PDQ21, PDQ31, PDQ41, PDQ51, PDQ61, PDQ71 and PDQS1.

The memory device 101 may include a clock pin PC2 receiving the clock signal CK, data I/O pins PDQ02, PDQ12, PDQ22, PDQ32, PDQ42, PDQ52, PDQ62 and PDQ72 communicating the data signals DQ0, DQ1, DQ2, DQ3, DQ4, DQ5, DQ6 and DQ7, and a data strobe pin PDQS2 providing the data strobe signal DQ5. Although not shown in FIG. 5A, the memory device 101 may further include transmitters and receivers variously connected to the pins PC2, PDQ02, PDQ12, PDQ22, PDQ32, PDQ42, PDQ52, PDQ62, PDQ72 and PDQS2.

The host device 51 and the memory device 101 may be mounted on the substrate 20, and electrically connected to another. The substrate 20 may be a single-layer substrate or a multi-layered substrate including an upper surface and an opposing lower surface.

The substrate 20 may include signal transmission lines (e.g., electrically conductive wirings) LC, LDQ0, LDQ1, LDQ2, LDQ3, LDQ4, LDQ5, LDQ6, LDQ7 and LDQS formed on and/or within the body of the substrate 20. The signal transmission line LC may be electrically connected to the clock pins PC1 and PC2, and may transmit the clock signal CK. Each of the signal transmission lines LDQ0, LDQ1, LDQ2, LDQ3, LDQ4, LDQ5, LDQ6 and LDQ7 may be connected to a respective one of the data I/O pins PDQ01, PDQ11, PDQ21, PDQ31, PDQ41, PDQ51, PDQ61 and PDQ71 and a respective one of the data I/O pins PDQ02, PDQ12, PDQ22, PDQ32, PDQ42, PDQ52, PDQ62 and PDQ72, and may transmit a respective one of the data signals DQ0, DQ1, DQ2, DQ3, DQ4, DQ5, DQ6 and DQ7. The signal transmission line LDQ5 may be electrically connected to the data strobe pins PDQS1 and PDQS2, and may transmit the data strobe signal DQ5.

Although FIG. 5A shows the data signals DQ0, DQ1, DQ2, DQ3, DQ4, DQ5, DQ6 and DQ7 and the data strobe signal DQ5 are communicated from the memory device 101 to the host device 51, other embodiments of the inventive concept are not limited thereto. For example, the data signals DQ0, DQ1, DQ2, DQ3, DQ4, DQ5, DQ6 and DQ7 and the data strobe signal DQ5 may be communicated from the host device 51 to the memory device 101.

FIG. 5B is a layout diagram illustrating in one example an arrangement of the signal transmission lines LDQ0, LDQ1, LDQ2, LDQ3, LDQ4, LDQ5, LDQ6 and LDQ7 that may be included in a substrate 21.

In some embodiments, an arrangement order of the data I/O pins PDQ02, PDQ12, PDQ22, PDQ32, PDQ42, PDQ52, PDQ62 and PDQ72 in the memory device 101 illustrated in FIG. 5A may be different from an arrangement order of the signal transmission lines LDQ0, LDQ1, LDQ2, LDQ3, LDQ4, LDQ5, LDQ6 and LDQ7 in the substrate 21 illustrated in FIG. 5B. For example, the data I/O pins may be arranged in an order of PDQ02, PDQ12, PDQ22, PDQ32, PDQ42, PDQ52, PDQ62 and PDQ72 from top to bottom, and the signal transmission lines may be arranged in an order of LDQ1, LDQ7, LDQ2, LDQ6, LDQ5, LDQ4, LDQ3 and LDQ0 along a line I-I'.

Referring to FIGS. 2A and 2B in the context of FIGS. 5A and 5B, it is important to define appropriate training patterns for each data I/O pin in consideration of a related condition (e.g., the first condition, such as the odd mode, or the second condition, such as the even mode). Although a pin ordering and/or pad ordering for the memory device 101 is basically defined by an ordering of pin numbers, the signal transmission lines connected to the data I/O pins may not be arranged or disposed in the same order as the pin numbers when the substrate 20 (21) is designed. Thus, it has been conventionally difficult to properly define training patterns in advance, because different products have different designs. Nonetheless, training patterns consistent with embodiments of the inventive concept (as well as training operation(s) and signal alignment operation(s)) may be performed in consideration of a worst condition for each data I/O pin.

Figure 6:
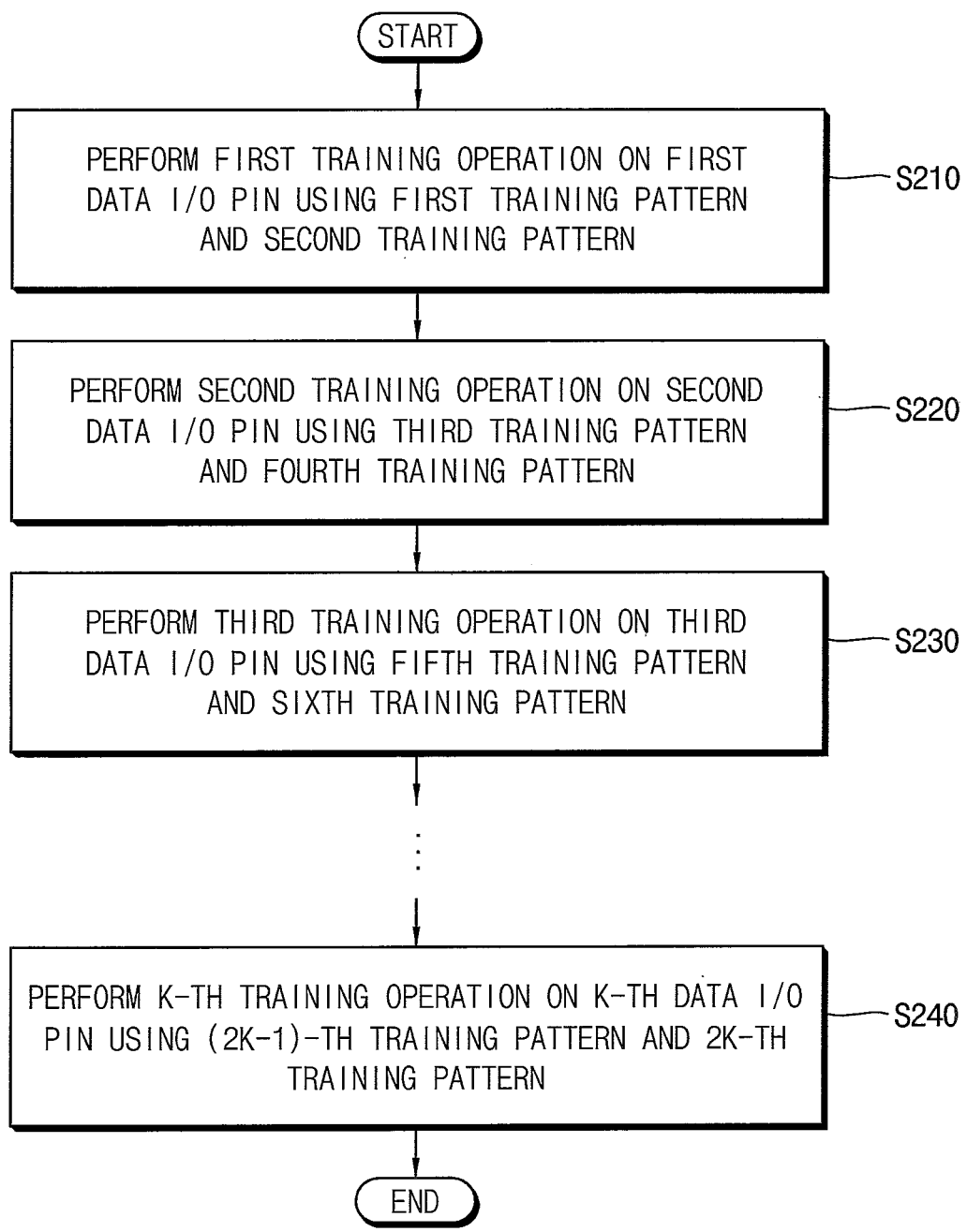
FIG. 6 is a flowchart further illustrating in one example a training operation associated with the method of FIG. 1.

FIG. 6 is a flowchart further illustrating in one example the performing a training operation (S200) in the method of FIG. 1.

Referring to FIGS. 1, 5A and 6, the training operation (S200) may be a DQ calibration operation in which all data signals are centered with respect to a data strobe signal (e.g., in which centers of all data signals are aligned with an edge of the data strobe signal). For example, the training operation may be a read DQ calibration operation correcting (e.g., increasing or improving) a data eye while a data read operation is performed on the memory device 101.

In some embodiments, the training operation may be performed using a first training pattern having the first condition, and the second training pattern having the second condition in order to perform the read DQ calibration operation. Here, the first training pattern and second training pattern may be stored in the memory device 101 (e.g., in a mode register, see, e.g., the mode register 212 of FIG. 4.

In some embodiments, the training command communicated (S100) to initiate the training operation may include a mode register write (MRW) command and a multi-purpose command (MPC). When the MRW command is communicated, the memory device 101 may load DQ calibration patterns (or read patterns) including the first training pattern and the second training pattern, and may store (or set) the DQ calibration patterns in the mode register 212. When the MPC command is subsequently communicated, the memory device 101 may provide the first training pattern and the second training pattern through the data I/O pins PDQ02, PDQ12, PDQ22, PDQ32, PDQ42, PDQ52, PDQ62 and PDQ72, and may perform the training operation using the first training pattern and the second training pattern.

Thus, the training operation (S200) may include; a first training operation performed on the first data I/O pin PDQ02 providing the first data signal DQ0 using the first training pattern and the second training pattern (step S210). Here, for example, the first training operation may be performed by setting the first training pattern and the second training pattern in the mode register 212, and then providing the data signals DQ0, DQ1, DQ2, DQ3, DQ4, DQ5, DQ6 and DQ7 through the data I/O pins PDQ02, PDQ12, PDQ22, PDQ32, PDQ42, PDQ52, PDQ62 and PDQ72 according to the first training pattern and the second training pattern. In this regard, the first training pattern and the second training pattern may be directly output from the mode register 212 without passing through the memory cell array. Examples of the first training pattern and the second training pattern will be described hereafter with reference to FIGS. 7A and 7B.

In some embodiments, a result of the first training operation may be stored in an internal memory (e.g., the internal memory 70 in FIG. 3) included in the host device 51. For example, a training status may be checked after the first training operation is performed. When the training status corresponds to a PASS result, it may be readily determined that the first training operation was successfully completed, and the result of the first training operation may be stored. However, when the training status corresponds to a FAIL result, it may be readily determined that the first training operation was not successfully completed. Thus, the first training operation may be repeatedly until the first training operation is successfully completed.

In some embodiments, once the first training operation has been successfully completed, the training pattern(s) set in the mode register may be (but need not always be) respectively changed from the first training pattern and the second training pattern to some other training pattern used during a subsequent training operation.

Accordingly, a second training operation may be performed on the second data I/O pin PDQ12 providing the second data signal DQ1 using a third training pattern and a fourth training pattern (S220); a third training operation may be performed on the third data I/O pin PDQ22 providing the third data signal DQ2 using a fifth training pattern and a sixth training pattern (S230); until a K-th training operation may be performed on a K-th data I/O pin providing a K-th data signal using a (2K−1)-th training pattern and a 2K-th training pattern, where 'K' is a natural number greater than one (S240). Here, the value 'K' may correspond to a number of data I/O pins (e.g., PDQ02, PDQ12, PDQ22, PDQ32, PDQ42, PDQ52, PDQ62 and PDQ72). Thus, in FIG. 5A, K=8, and the K-th training operation, the K-th data I/O pin and the K-th data signal may be an eighth training operation, the eighth data I/O pin PDQ72 and the eighth data signal DQ7, respectively.

It should be noted that the respective training operations described above in relation to steps S220, S230 and S240 may be substantially the same as the training operation described in relation to steps S210. However, the constituent training pattern(s) used in the respective training operations may be varied. Exemplary third, fifth and (2K−1)-th training patterns will be described hereafter in relation to FIGS. 8A, 8B, 8C, 8D, 8E, 8F and 8G.

FIGS. 7A, 7B, 8A, 8B, 8C, 8D, 8E, 8F and 8G are conceptual diagrams further illustrating the training operation of the methods of FIGS. 1 and 6.

Figure 7A:
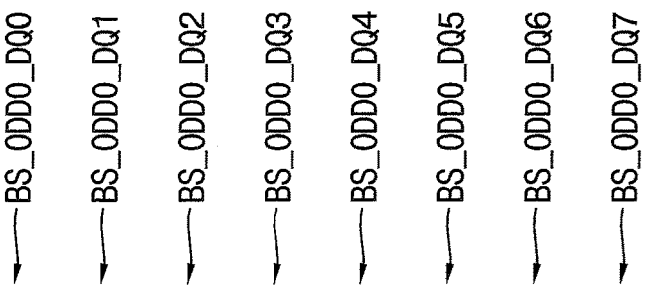

Referring to FIG. 7A, a first training pattern TP_ODD_DQ0 may be defined according to the first condition and may be used during the first training operation (S210).

For example, the first training pattern TP_ODD_DQ0 may include first bit sequences (e.g., BS_ODD0_DQ0, BS_ODD0_DQ1, BS_ODD0_DQ2, BS_ODD0_DQ3, BS_ODD0_DQ4, BS_ODD0_DQ5, BS_ODD0_DQ6 and BS_ODD0_DQ7), wherein each of the first bit sequences corresponds to one of the data I/O pins (e.g., PDQ02, PDQ12, PDQ22, PDQ32, PDQ42, PDQ52, PDQ62 and PDQ72) respectively providing one data bit ('0' or '1') to a corresponding one of bitlines BL0, BL1, BL2, BL3, BL4, BL5, BL6, BL7, BL8, BL9, BL10, BL11, BL12, BL13, BL14 and BL15.

Thus, the first bit sequence BS_ODD0_DQ0 may correspond to the first data I/O pin PDQ02 providing the first data signal DQ0, and so on, through the first bit sequences . . . to the first bit sequence BS_ODD0_DQ7 that may correspond to the eighth data I/O pin PDQ72 providing the eighth data signal DQ7.

In some embodiments, the first training pattern TP_ODD_DQ0 may be a training pattern having (or defined in relation to) the first condition (e.g., the odd mode). Accordingly, the first data I/O pin PDQ02, and the first bit sequence BS_ODD0_DQ0 corresponding to the first data I/O pin PDQ02 may be different from the remaining first bit sequences (e.g., BS_ODD0_DQ1, BS_ODD0_DQ2, BS_ODD0_DQ3, BS_ODD0_DQ4, BS_ODD0_DQ5, BS_ODD0_DQ6 and BS_ODD0_DQ7 corresponding to the remaining data I/O pins PDQ12, PDQ22, PDQ32, PDQ42, PDQ52, PDQ62 and PDQ72). Hence, the first bit sequence BS_ODD0_DQ0 may be "1010101001010101", while the remaining first bit sequences may be "0101010110101010". An inverted bit sequence obtained by inverting the first bit sequence BS_ODD0_DQ0 may be substantially equal to each of the first bit sequences BS_ODD0_DQ1, BS_ODD0_DQ2, BS_ODD0_DQ3, BS_ODD0_DQ4, BS_ODD0_DQ5, BS_ODD0_DQ6 and BS_ODD0_DQ7.

Hence, in the first training operation (S210), a first sub-training operation may be performed by providing the first data signal DQ0 corresponding to the first bit sequence BS_ODD0_DQ0 through the first data I/O pin PDQ02 and by providing the remaining data signals DQ1, DQ2, DQ3, DQ4, DQ5, DQ6 and DQ7 corresponding to the remaining first bit sequences BS_ODD0_DQ1, BS_ODD0_DQ2, BS_ODD0_DQ3, BS_ODD0_DQ4, BS_ODD0_DQ5, BS_ODD0_DQ6 and BS_ODD0_DQ7 through the remaining data I/O pins PDQ12, PDQ22, PDQ32, PDQ42, PDQ52, PDQ62 and PDQ72, respectively.

Figure 7B:
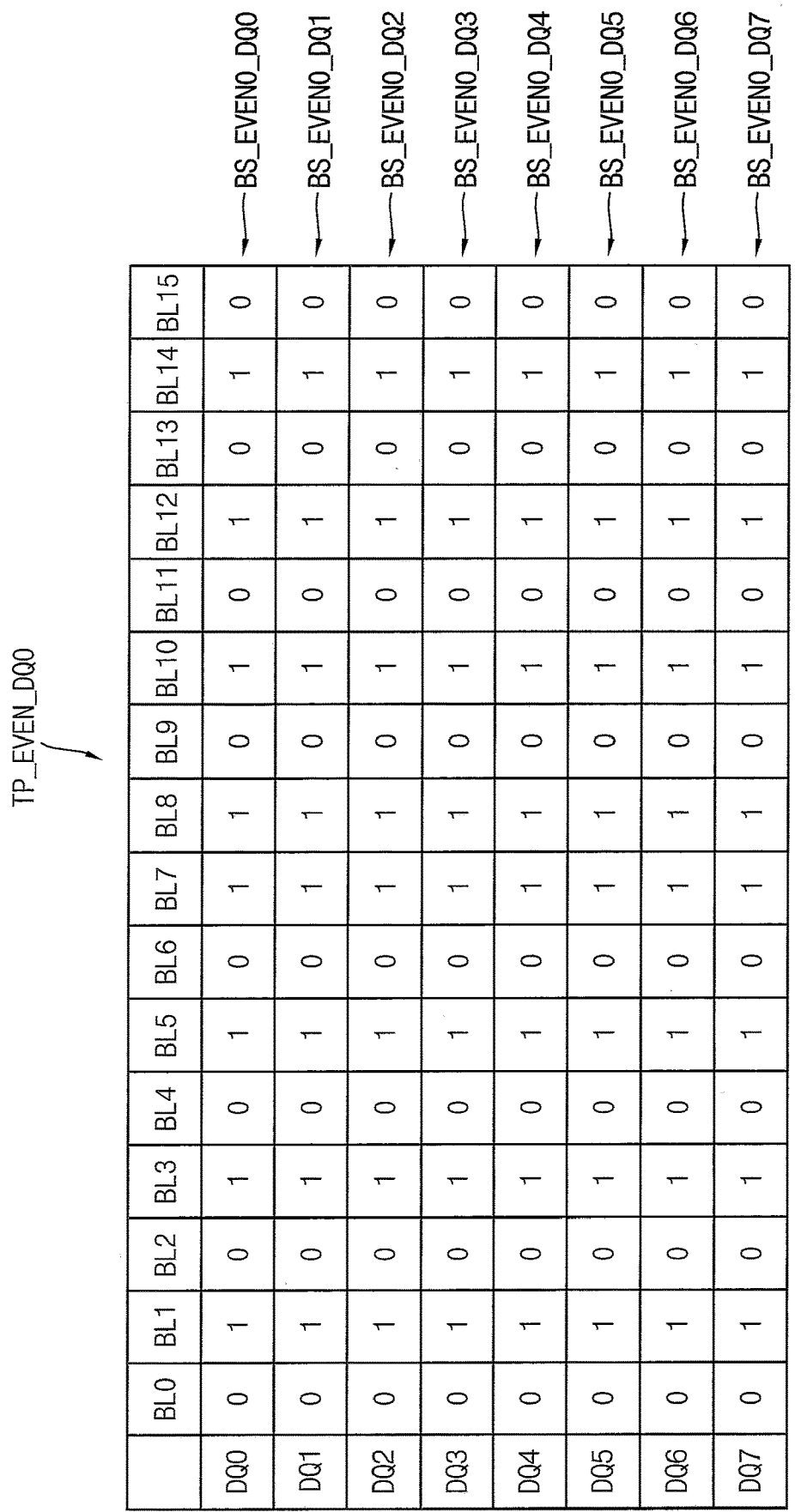

Referring to FIG. 7B, a second training pattern TP_EVEN_DQ0 may be defined according to the second condition and may be used during the first training operation (S210).

In some embodiments, the second training pattern TP_EVEN_DQ0 may include second bit sequences (e.g., BS_EVEN0_DQ0, BS_EVEN0_DQ1, BS_EVEN0_DQ2, BS_EVEN0_DQ3, BS_EVEN0_DQ4, BS_EVEN0_DQ5, BS_EVEN0_DQ6 and BS_EVEN0_DQ7), wherein each of the second bit sequences may correspond to one of the data I/O pins PDQ02, PDQ12, PDQ22, PDQ32, PDQ42, PDQ52, PDQ62 and PDQ72 respectively providing a data bit to a corresponding one of bitlines BL0, BL1, BL2, BL3, BL4, BL5, BL6, BL7, BL8, BL9, BL10, BL11, BL12, BL13, BL14 and BL15.

Thus, the first bit sequence BS_EVEN0_DQ0 may correspond to the first data I/O pin PDQO2 providing the first data signal DQ0, and so on, through the first bit sequences . . . to the first bit sequence BS_EVEN0_DQ7 that may correspond to the eighth data I/O pin PDQ72 providing the eighth data signal DQ7.

In some embodiments, the second training pattern TP_EVEN_DQ0 may be a training pattern having (or defined in relation to) the second condition (e.g., the even mode) for the first data I/O pin PDQ02, as well as all other second bit sequences. In this regard, each of the second bit sequences may be "0101010110101010".

Referring to FIGS. 6, 7A and 8A, a third training pattern TP_ODD_DQ1 may also be defined in relation to the first condition and may be used to perform the second training operation (S220).

In some embodiments, the third training pattern TP_ODD_DQ1 may include third bit sequences (e.g., BS_ODD1_DQ0, BS_ODD1_DQ1, BS_ODD1_DQ2, BS_ODD1_DQ3, BS_ODD1_DQ4, BS_ODD1_DQ5, BS_ODD1_DQ6 and BS_ODD1_DQ7), wherein each third bit sequence may correspond to one data I/O pin providing one of the data signals.

Thus, the third training pattern TP_ODD_DQ1 may be a training pattern having (defined in relation to) the first condition (e.g., the odd mode) for the second data I/O pin PDQ12, and the third bit sequence BS_ODD1_DQ1 corresponding to the second data I/O pin PDQ12 may be different from the remaining third bit sequences (e.g., BS_ODD1_DQ0, BS_ODD1_DQ2, BS_ODD1_DQ3, BS_ODD1_DQ4, BS_ODD1_DQ5, BS_ODD1_DQ6 and BS_ODD1_DQ7) that correspond respectively to the remaining data I/O pins (e.g., PDQ02, PDQ22, PDQ32, PDQ42, PDQ52, PDQ62 and PDQ72).

Hence, during the second training operation (S220), a first sub-training operation may be performed by providing the second data signal DQ1 corresponding to the third bit sequence BS_ODD1_DQ1 (e.g., "1010101001010101") through the second data I/O pin PDQ12 and by respectively providing the remaining data signals DQ0, DQ2, DQ3, DQ4, DQ5, DQ6 and DQ7 corresponding to the remaining third bit sequences (e.g., "0101010110101010") through the remaining data I/O pins.

The fourth training pattern may have (or be defined by) the second condition and may be used to perform the second training operation (S220) in substantially the same manner as the second training pattern TP_EVEN_DQ0 of FIG. 7B. For example, the fourth training pattern may include fourth bit sequences that are all substantially the same. During the second training operation (S220), a second sub-training operation may be performed using the fourth training pattern.

Referring to FIGS. 6, 7A and 8B, a fifth training pattern TP_ODD_DQ2 may have the first condition and be used during the third training operation (S230).

In some embodiments, the fifth training pattern TP_ODD_DQ2 may include fifth bit sequences (e.g., BS_ODD2_DQ0, BS_ODD2_DQ1, BS_ODD2_DQ2, BS_ODD2_DQ3, BS_ODD2_DQ4, BS_ODD2_DQ5, BS_ODD2_DQ6 and BS_ODD2_DQ7), wherein each fifth bit sequence may correspond to one data I/O pin, and may correspond to one data signal provided by the one data I/O pin.

In some embodiments, the fifth training pattern TP_ODD_DQ2 may be a training pattern having the first condition (e.g., the odd mode) for the third data I/O pin PDQ22, and the fifth bit sequence BS_ODD2_DQ2 corresponding to the third data I/O pin PDQ22 may be different from the remaining fifth bit sequences (e.g., BS_ODD2_DQ0, BS_ODD2_DQ1, BS_ODD2_DQ3, BS_ODD2_DQ4, BS_ODD2_DQ5, BS_ODD2_DQ6 and BS_ODD2_DQ7) corresponding to the remaining data I/O pins (e.g., PDQ02, PDQ12, PDQ32, PDQ42, PDQ52, PDQ62 and PDQ72).

During the third training operation (S230) in FIG. 6, a first sub-training operation may be performed by providing the third data signal DQ2 corresponding to "1010101001010101" through the third data I/O pin PDQ22 and by providing the remaining data signals DQ0, DQ1, DQ3, DQ4, DQ5, DQ6 and DQ7 corresponding to "0101010110101010" through the remaining data I/O pins PDQ02, PDQ12, PDQ32, PDQ42, PDQ52, PDQ62 and PDQ72, respectively.

In some embodiments, the sixth training pattern having the second condition may be used to perform the third training operation (S230) and may be substantially the same as the second training pattern TP_EVEN_DQ0 of FIG. 7B. For example, the sixth training pattern may include sixth bit sequences that are all substantially the same. During the third training operation (S230), a second sub-training operation may be performed using the sixth training pattern.

Figure 8C:
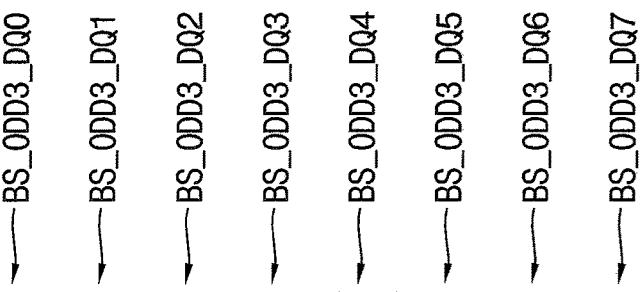

Referring to FIGS. 6, 7A and 8C, a seventh training pattern TP_ODD_DQ3 having the first condition may be used to perform a fourth training operation on the fourth data I/O pin PDQ32 outputting the fourth data signal DQ3.

In some embodiments, the seventh training pattern TP_ODD_DQ3 may include a seventh bit sequences (e.g., BS_ODD3_DQ0, BS_ODD3_DQ1, BS_ODD3_DQ2, BS_ODD3_DQ3, BS_ODD3_DQ4, BS_ODD3_DQ5, BS_ODD3_DQ6, and BS_ODD3_DQ7), each of which corresponds to one data I/O pin and one data signal. In some embodiments, the seventh bit sequence BS_ODD3_DQ3 corresponding to the fourth data I/O pin PDQ32 may be different from the remaining seventh bit sequences (e.g., BS_ODD3_DQ0, BS_ODD3_DQ1, BS_ODD3_DQ2, BS_ODD3_DQ4, BS_ODD3_DQ5, BS_ODD3_DQ6 and BS_ODD3_DQ7) corresponding to the remaining data I/O pins (e.g., PDQ02, PDQ12, PDQ22, PDQ42, PDQ52, PDQ62 and PDQ72).

Referring to FIG. 8D, a ninth training pattern TP_ODD_DQ4 having the first condition may be used to perform a fifth training operation on the fifth data I/O pin PDQ42 providing the fifth data signal DQ4.

In some embodiments, the ninth training pattern TP_ODD_DQ4 may include ninth bit sequences (e.g., BS_ODD4_DQ0, BS_ODD4_DQ1, BS_ODD4_DQ2, BS_ODD4_DQ3, BS_ODD4_DQ4, BS_ODD4_DQ5, BS_ODD4_DQ6 and BS_ODD4_DQ7), each of which corresponds to one data I/O pin and one data signal. In some embodiments, the ninth bit sequence BS_ODD4_DQ4 corresponding to the fifth data I/O pin PDQ42 may be different from the remaining ninth bit sequences (e.g., BS_ODD4_DQ0, BS_ODD4_DQ1, BS_ODD4_DQ2, BS_ODD4_DQ3, BS_ODD4_DQ5, BS_ODD4_DQ6 and BS_ODD4_DQ7) corresponding to the remaining data I/O pins (e.g., PDQ02, PDQ12, PDQ22, PDQ32, PDQ52, PDQ62 and PDQ72).

Referring to FIGS. 6, 7A and 8E, an eleventh training pattern TP_ODD_DQ5 having the first condition may be used to perform a sixth training operation on the sixth data I/O pin PDQ52 providing the sixth data signal DQ5.

In some embodiments, the eleventh training pattern TP_ODD_DQ5 may include eleventh bit sequences (e.g., BS_ODD5_DQ0, BS_ODD5_DQ1, BS_ODD5_DQ2, BS_ODD5_DQ3, BS_ODD5_DQ4, BS_ODD5_DQ5, BS_ODD5_DQ6 and BS_ODD5_DQ7), each of which corresponds to one data I/O pin and one data signal. In some embodiments, the eleventh bit sequence BS_ODD5_DQ5 corresponding to the sixth data I/O pin PDQ52 may be different from the remaining eleventh bit sequences (e.g., BS_ODD5_DQ0, BS_ODD5_DQ1, BS_ODD5_DQ2, BS_ODD5_DQ3, BS_ODD5_DQ4, BS_ODD5_DQ6 and BS_ODD5_DQ7) corresponding to the remaining data I/O pins (e.g., PDQ02, PDQ12, PDQ22, PDQ32, PDQ42, PDQ62 and PDQ72).

Referring to FIGS. 6, 7A and 8F, a thirteenth training pattern TP_ODD_DQ6 having the first condition may be used to perform a seventh training operation on the seventh data I/O pin PDQ62 providing the seventh data signal DQ6.

In some embodiments, the thirteenth training pattern TP_ODD_DQ6 may include a thirteenth bit sequences (e.g., BS_ODD6_DQ0, BS_ODD6_DQ1, BS_ODD6_DQ2, BS_ODD6_DQ3, BS_ODD6_DQ4, BS_ODD6_DQ5, BS_ODD6_DQ6 and BS_ODD6_DQ7), each of which corresponds to one data I/O pin and one data signal. In some embodiments, the thirteenth bit sequence BS_ODD6_DQ6 corresponding to the seventh data I/O pin PDQ62 may be different from the remaining thirteenth bit sequences (e.g., BS_ODD6_DQ0, BS_ODD6_DQ1, BS_ODD6_DQ2, BS_ODD6_DQ3, BS_ODD6_DQ4, BS_ODD6_DQ5 and BS_ODD6_DQ7) corresponding to the remaining data I/O pins (e.g., PDQ02, PDQ12, PDQ22, PDQ32, PDQ42, PDQ52 and PDQ72).

Referring to FIGS. 6, 7A and 8G, a fifteenth training pattern TP_ODD_DQ7 having the first condition may be used to perform the eighth training operation on the eighth data I/O pin PDQ72 providing the eighth data signal DQ7.

In some embodiments, the fifteenth training pattern TP_ODD_DQ7 may include fifteenth bit sequences (e.g., BS_ODD7_DQ0, BS_ODD7_DQ1, BS_ODD7_DQ2, BS_ODD7_DQ3, BS_ODD7_DQ4, BS_ODD7_DQ5, BS_ODD7_DQ6 and BS_ODD7_DQ7), each of which corresponds to one data I/O pin and one data signal. In some embodiments, the fifteenth bit sequence BS_ODD7_DQ7 corresponding to the eighth data I/O pin PDQ72 may be different from the remaining fifteenth bit sequences (e.g., BS_ODD7_DQ0, BS_ODD7_DQ1, BS_ODD7_DQ2, BS_ODD7_DQ3, BS_ODD7_DQ4, BS_ODD7_DQ5 and BS_ODD7_DQ6) corresponding to the remaining data I/O pins (e.g., PDQ02, PDQ12, PDQ22, PDQ32, PDQ42, PDQ52 and PDQ62).

In some embodiments, an eighth training pattern, a tenth training pattern, a twelfth training pattern, a fourteenth training pattern and a sixteenth training pattern—each having or being defined by the second condition—may be used to perform the fourth training operation, the fifth training operation, the sixth training operation, the seventh training operation and the eighth training operation, respectively in substantially the same manner as the second training pattern TP_EVEN_DQ0 of FIG. 7B. For example, the eighth training pattern, the tenth training pattern, the twelfth training pattern, the fourteenth training pattern and the sixteenth training pattern may include, respectively, eighth bit sequences, tenth bit sequences, twelfth bit sequences, fourteenth bit sequences and sixteenth bit sequences—all of which are substantially the same.

Although certain embodiments of the inventive concept have been described in relation to a particular number of data signals, data I/O pins, and/or data bits, such particular configuration details do not generally limit the scope of the inventive concept.

Of additional note, the memory device 101 of FIG. 5A may further include a data mask pin providing a data mask (DM) signal. Accordingly, training operation(s) may be further performed in relation to the data mask pin. For example, the data mask pin and the data mask signal may not be bit inverted, and a number of training patterns may be used during a training operation directed to the data mask pin.

In methods of optimizing the DQ calibration patterns for the memory device according to embodiments of the inventive concept, the worst-performing one of the first pattern and second pattern may be identified for each of the data I/O pins. Thereafter, training operations may be performed on all of the data I/O pins by intelligently selecting particular pattern(s) for each of the data I/O pins. And signal alignment operations may be performed in accordance with results of the training operations. Thus, many different design variations may be addressed or accounted for using a number of differently-defined training operations, thereby optimizing DQS/DQ centering, despite the possible range of product designs.

Figure 9:
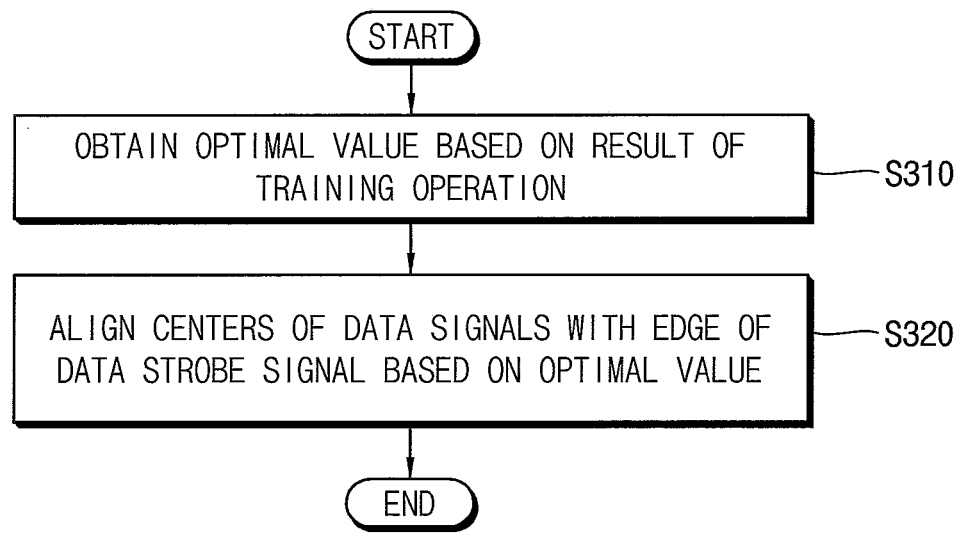
FIG. 9 is a flowchart illustrating in one example an alignment method for the aligning of a data strobe signal and data signals in relation to the method of FIG. 1.

FIG. 9 is a flowchart further illustrating in one example the aligning of a data strobe signal with data signals (S300 in FIG. 1).

Referring to FIGS. 1, 5A, 6 and 9, when aligning the data strobe signal and data signals (S300), an optimal value may be obtained based on or using results of training operation(s) (S310). For example, assuming the approach described in relation to the method of FIG. 6, results for the 2K training operations may be collected, and an optimal value may be obtained in relation to the results. This optimal value may be used as one parameter (possibly among a number of parameters) used to perform the DQS/DQ centering. For example, the optimal value may include a valid (or effective) window margin. This approach will be described in some additional detail with reference to FIG. 10C.

Here, however, respective centers of the data signals DQ0, DQ1, DQ2, DQ3, DQ4, DQ5, DQ6 and DQ7 may be aligned with an edge of the data strobe signal DQS using the optimal value (S320). As a result, the read DQ calibration operation may be completed.

FIGS. 10A, 10B, 10C, 10D, 11A and 11B are respective, signal waveform diagrams further illustrating an alignment operation like the one described in relation to FIG. 9.

Figure 10A:
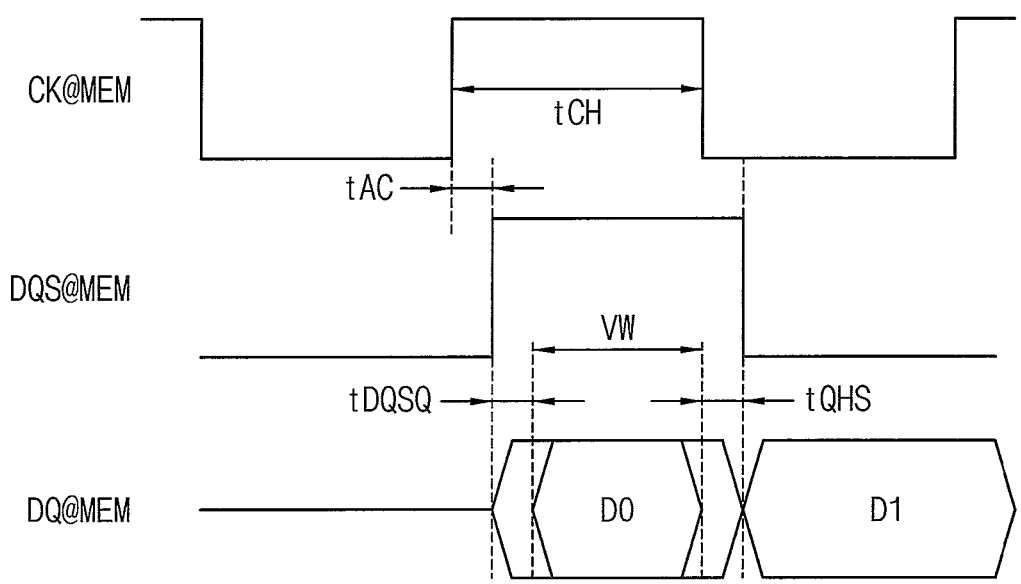
FIGS. 10A, 10B, 10C, 10D, 11A and 11B are signal waveform diagrams further illustrating the alignment method of FIG. 9.

Referring to FIGS. 5A and 10A, examples of a clock signal CK@MEM, a data strobe signal DQS @MEM, and a data signal DQ@MEM for the memory device 101 are shown.

During the data read operation and/or the read DQ calibration operation, the memory device 101 may output the data strobe signal DQS @MEM and the data signal DQ@MEM in response to the clock signal CK@MEM, and the data strobe signal DQS @MEM and the data signal DQ@MEM may be edge-aligned (e.g., an edge of the data signal DQ@MEM may be aligned with an edge of the data strobe signal DQS@MEM). In FIG. 10A, "tAC" represents an output access time from the clock signal CK@MEM to the data signal DQ@MEM, "tDQSQ" represents a DQS/DQ skew between the data strobe signal DQS @MEM and the corresponding data signal DQ@MEM, and "tQHS represents a hold skew factor of the data signal DQ@ MEM. A valid window VW of data D0 and D1 included in the data signal DQ@ MEM may be determined by tDQSQ and tQHS.

Figure 10B:
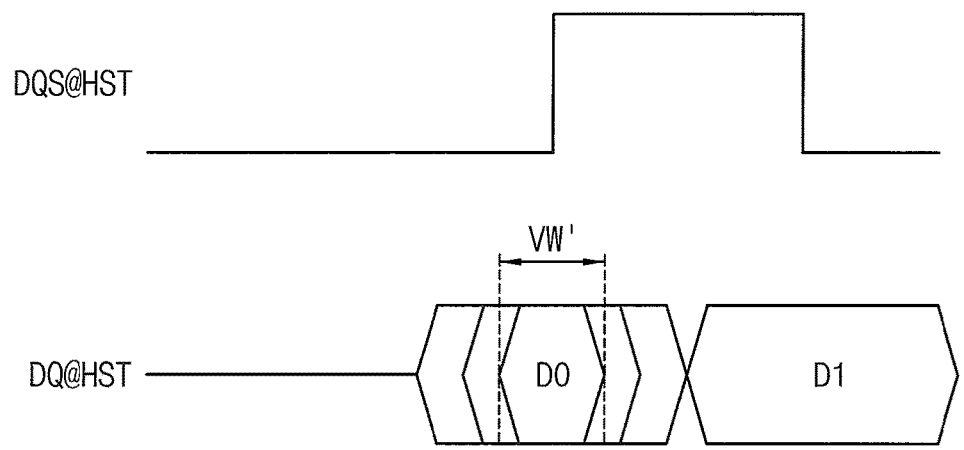

Referring to FIGS. 5A and 10B, examples of a data strobe signal DQS @HST and a data signal DQ@HST received and aligned by the host device 51 are shown.

Among the data strobe signal DQS @MEM and the data signal DQ@MEM that are edge-aligned by and output from the memory device 101, the host device 51 may generate the data strobe signal DQS @HST, which is a shifted data strobe signal, by phase-shifting the data strobe signal DQS@MEM by about 90 degrees. Thus, the data strobe signal DQS @HST and the data signal DQ@HST may be center-aligned (e.g., a center of the data signal DQ@HST may be aligned with an edge of the data strobe signal DQS @HST). When such DQS/DQ centering is performed, the data signal DQ@HST may be captured using the data strobe signal DQS@HST as a clock signal. In addition, a DQS/DQ skew may occur depending on the internal characteristics of the signal transmission path, e.g., the substrate, the I/O circuit, the package, etc., and the DQS/DQ centering may be performed by compensating the DQS/DQ skew. Therefore, a valid window VW of the data signal DQ@HST at the receiving end (e.g., at the host device 51) may be decreased as compared with the valid window VW of the data signal DQ@MEM at the transmitting end (e.g., at the memory device 101).

Figure 10C:
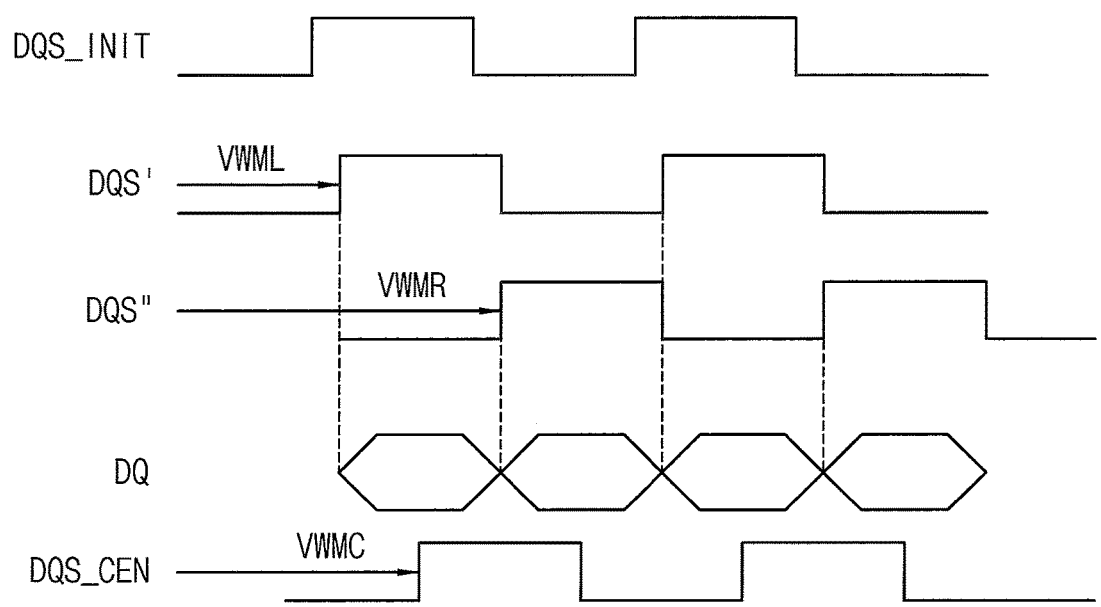
Figure 10D:
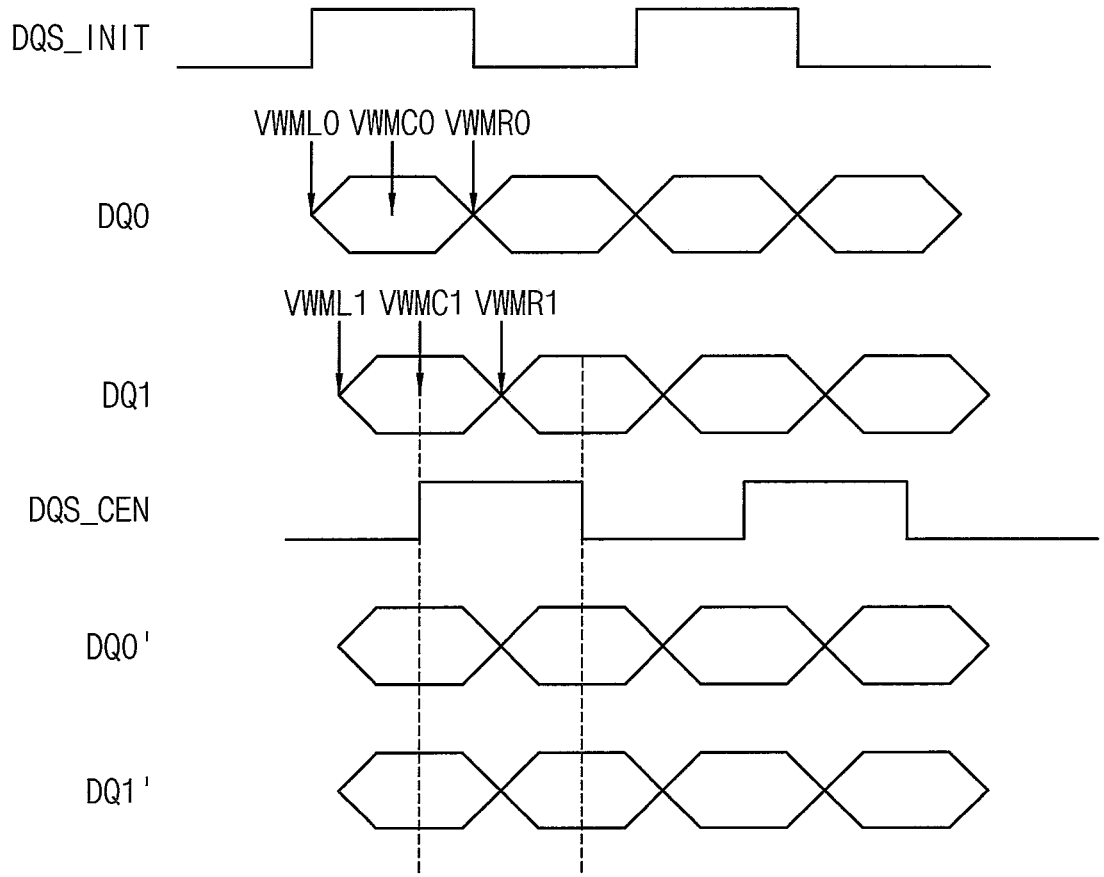

Referring to FIGS. 10C and 10D, examples of the DQS/DQ centering are shown in some additional detail.

In some embodiments like the one illustrated in FIG. 10C, delayed data strobe signals DQS' and DQS" are edge-aligned with the data signal DQ, and may be obtained by delaying an initial data strobe signal (or received data strobe signal) DQS_INIT by a first margin VWML and a second margin VWMR, respectively. Afterwards, a data strobe signal DQS_CEN center-aligned with the data signal DQ may be obtained by delaying the initial data strobe signal DQS_INIT by a third margin VWMC. For example, VWMC=(VWML+VWMR)/2, and the margins VWML, VWMR and VWMC may be obtained by checking a pass region within the valid window.

In some embodiments like the one illustrated in FIG. 10D, margins VWML0, VWMC0, VWMR0, VWML1, VWMC1 and VWMR1 may be obtained from the data signals DQ0 and DQ1. Afterwards, in response to the margins VWML0, VWMC0, VWMR0, VWML1, VWMC1 and VWMR1, a data strobe signal DQS_CEN that is center-aligned with the data signal DQ1 may be obtained by delaying the initial data strobe signal DQS_INIT to correspond to the data signal DQ1 that is transmitted more slowly among the data signals DQ0 and DQ1. Afterwards, a delayed data signal DQ0' may be obtained by delaying the data signal DQ0, and a data signal DQ1' having the same phase as the data signal DQ1 may be obtained.

Figure 11A:
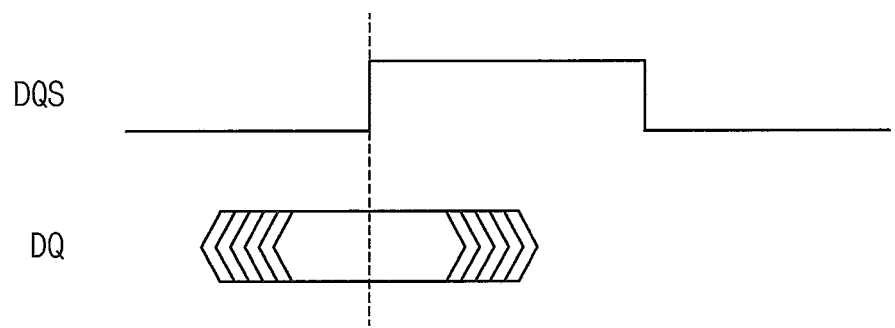

Referring to FIG. 11A, a phenomenon, wherein the phase of the data signal DQ may change depending on certain user scenarios (e.g., depending on data patterns actually transmitted), may occur even if DQS/DQ centering is performed as described above.

Figure 11B:
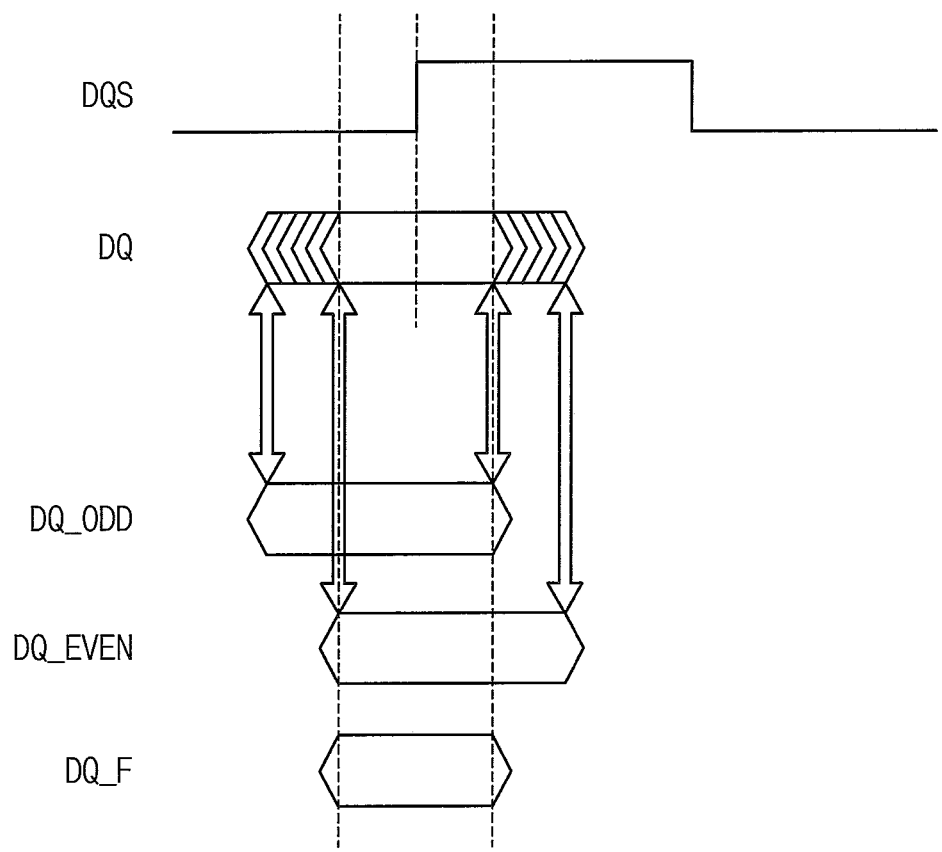

Referring to FIG. 11B, an example is shown wherein the training operation and the signal alignment operation are performed in consideration of a worst condition according to embodiments of the inventive concept. A data signal DQ_ODD represents a data signal received in response to the training pattern that has the first condition (e.g., the odd mode) and corresponds to the worst condition, and the data signal DQ_ODD may be relatively rapidly or quickly transmitted and arrived. A data signal DQ_EVEN represents a data signal received in response to the training pattern that has the second condition (e.g., the even mode) and corresponds to the worst condition, and the data signal DQ_EVEN may be relatively slowly transmitted and arrived. Afterwards, results of the training operations in response to the worst conditions may be overlapped to have a valid window corresponding to a data signal DQ_F. Therefore, the optimized DQS/DQ centering may be implemented for all cases.

Figure 12:
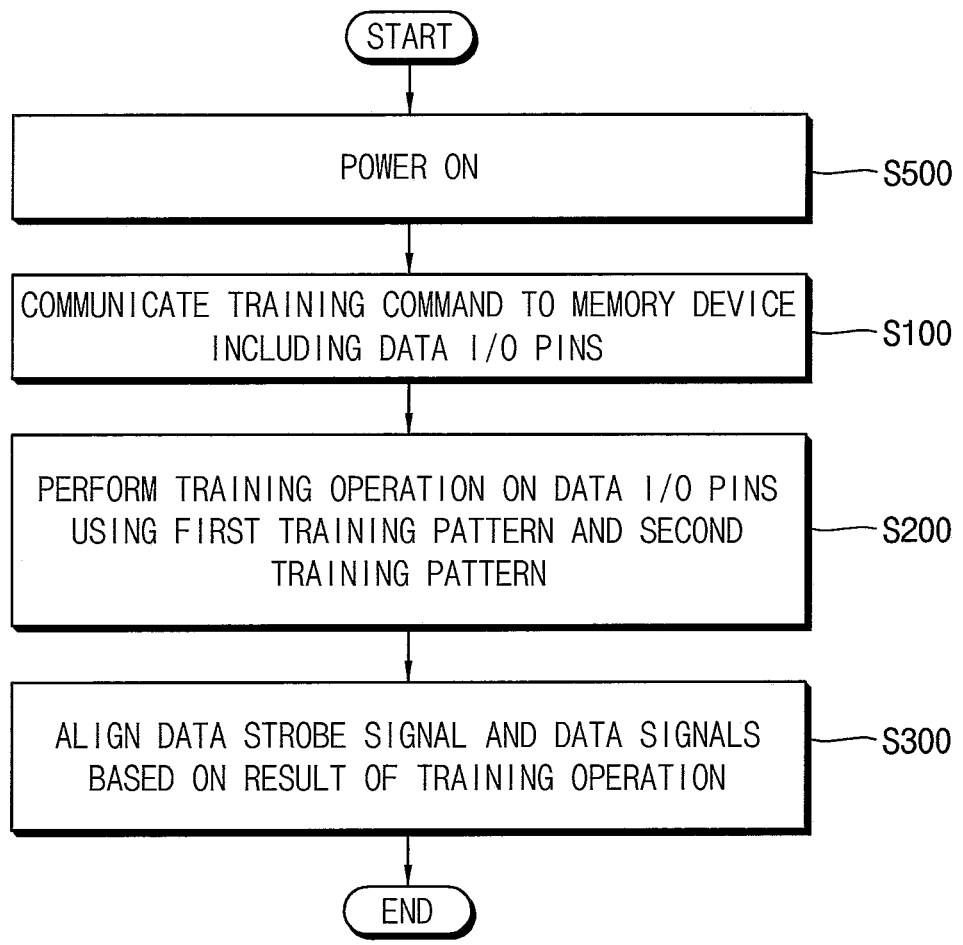
FIGS. 12 and 13 are flowcharts illustrating method(s) of optimizing DQ calibration patterns for a memory device according to embodiments of the inventive concept.
Figure 13:
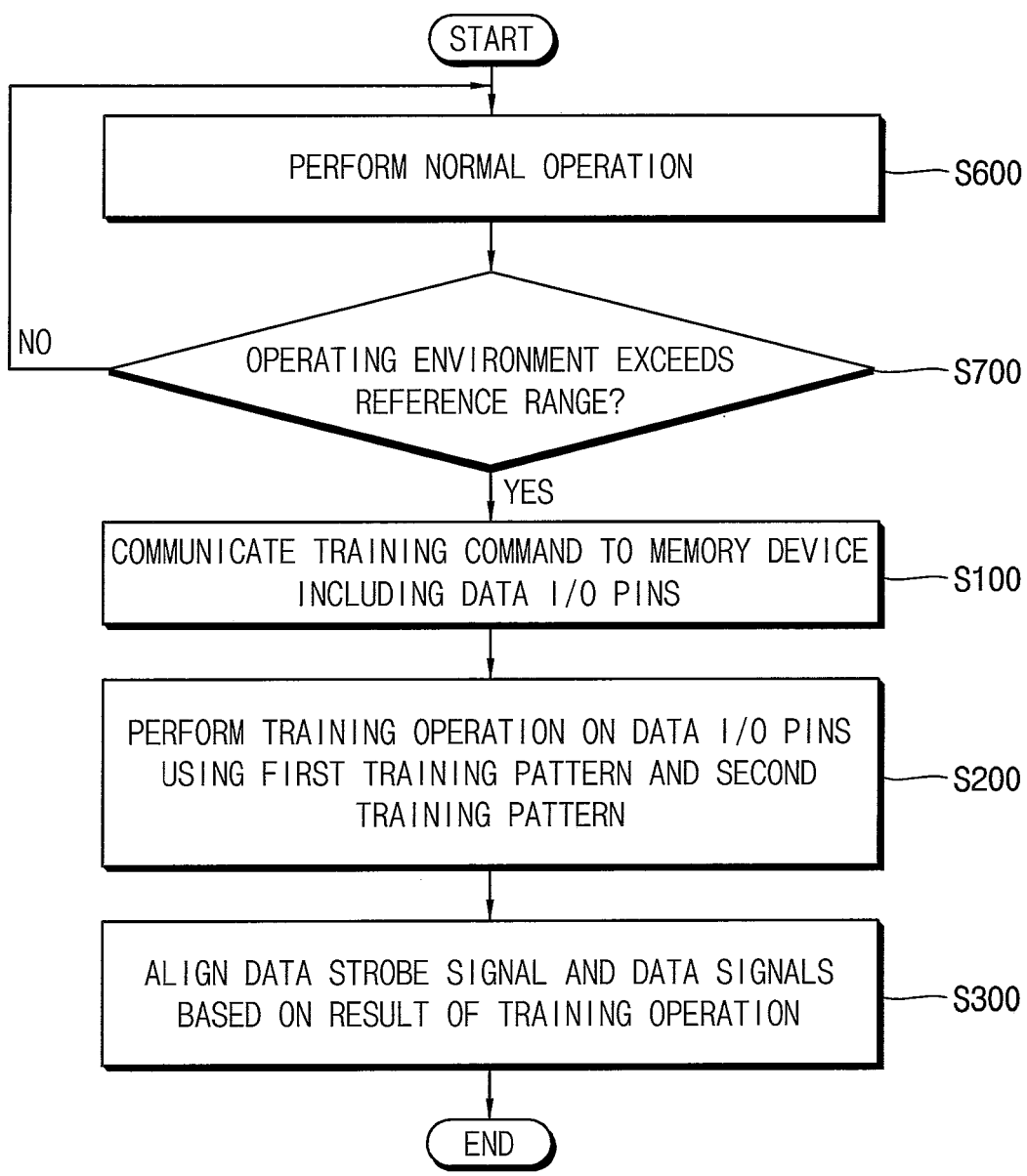

FIGS. 12 and 13 are respective flowcharts illustrating methods of optimizing DQ calibration patterns for a memory device according to embodiments of the inventive concept.

Referring to FIGS. 1, 3 and 12, a method of optimizing DQ calibration patterns for a memory device may be performed upon power-on of the memory device (S500). Thus, when the memory device 100 is powered on, the memory device 100 and the host device 50 may enter a training mode including at least method steps S100, S200 and S300 described in relation to FIG. 1. For example, when the memory device 100 is powered on, an initialization operation may be performed on the memory device, and the training operation may be included in the initialization operation. The initialization operation may be referred to as a booting operation or a series of operations in which the memory device 100 is booted. The booting operation may represent an operation of preparing a normal operation of the memory device by loading instruction codes as well as an operation of providing or applying power to the memory device 100.

Referring to FIGS. 1, 3 and 13, a method of optimizing DQ calibration patterns for a memory device may be performed during the course of executing normal operation (S600) within the computing system 10. In this regard, the term "normal" denotes an operational mode during which normal operations such as read operations and write operations may be performed by a memory device under the control of a host device.

Thus, so long as the operating environment for the computing system 10 does not exceed a defined reference range (S700=NO), normal operations may be performed (S600). However, when the operating environment for the computing system 10 exceeds the reference range in some material manner (S700=YES), the execution of normal operations may be suspended, and a method of optimizing DQ calibration patterns for the memory device 100 may be performed according to the method of FIG. 1.

Figure 14:
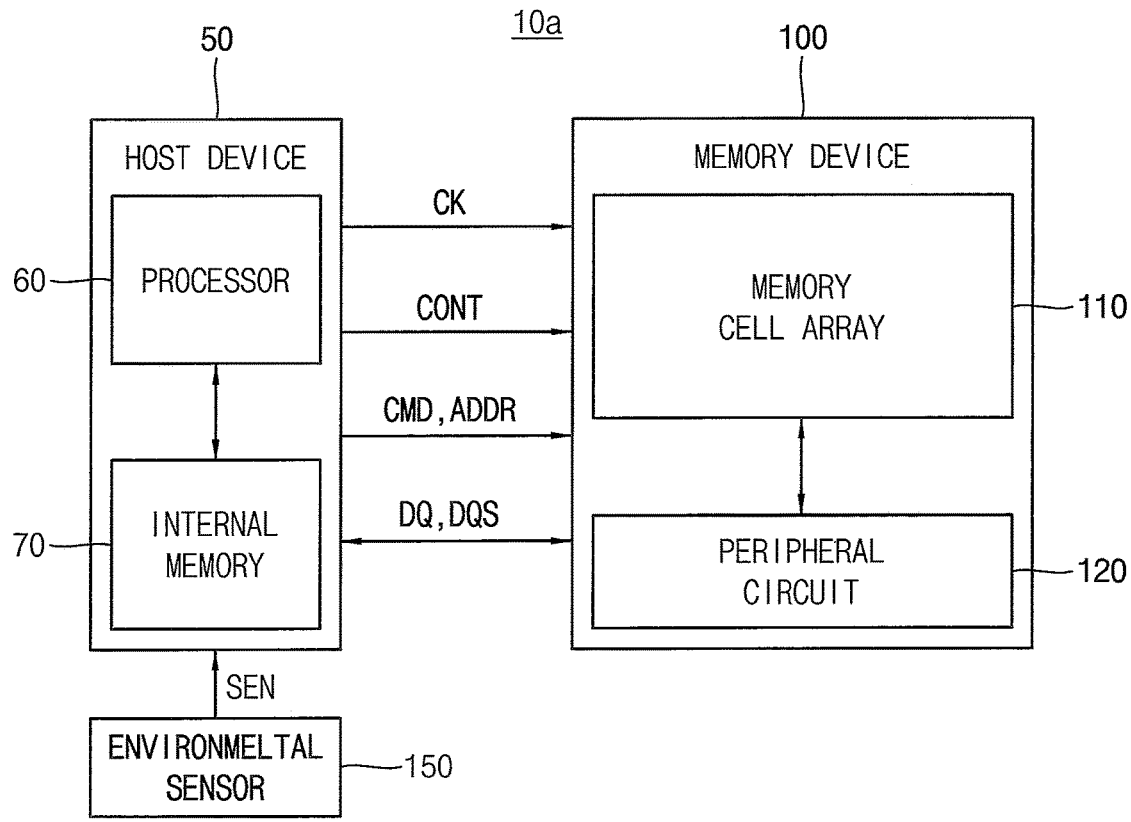
FIGS. 14 and 15 are block diagrams illustrating computing systems according to embodiments of the inventive concept.

Here, the determination of operating environment factors may be made by one or more environmental sensors, as described in relation to FIG. 14.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 15:
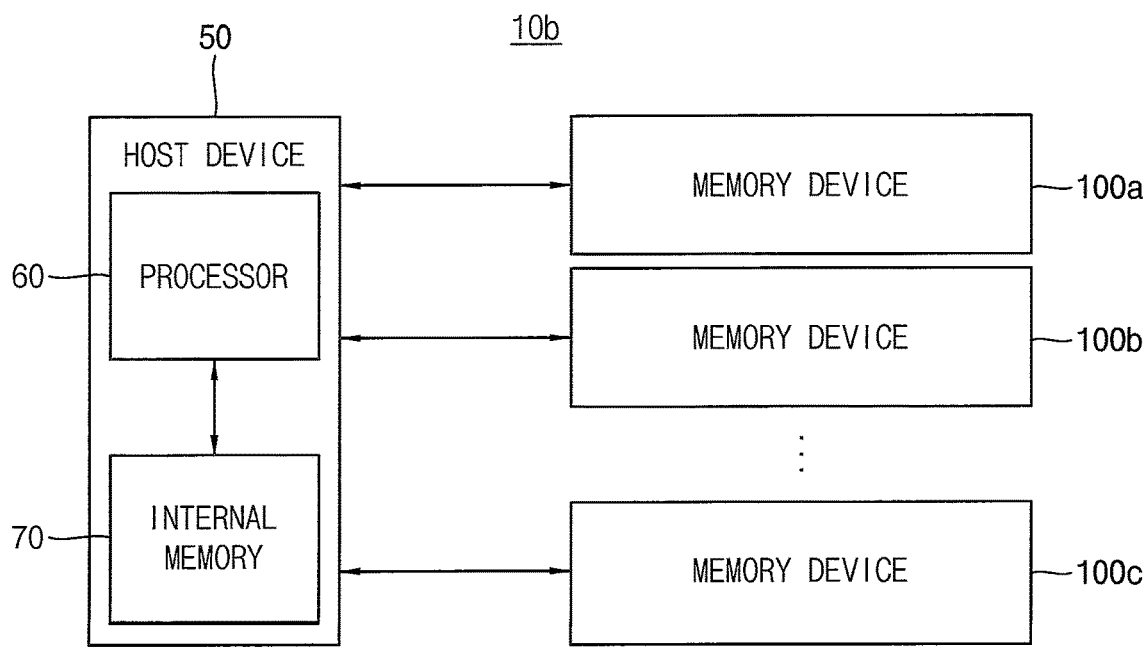

FIGS. 14 and 15 are block diagrams illustrating computing systems 10a and 10b according to embodiments of the inventive concept.

Referring to FIG. 14 and comparing the computing system 10 of FIG. 3, the computing system 10a may again include the host device 50 and the memory device 100. However, the computing system 10a further includes an environmental sensor 150.

The environmental sensor 150 may generate a sensing signal SEN by detecting a change in an operating environment (or a surrounding environment) of the computing system 10a. For example, the environmental sensor 150 may activate the sensing signal SEN when the operating environment changes to out of a predetermined reference range.

In some embodiments, the environmental sensor 150 may include at least one of a temperature sensor, a humidity sensor, a pressure sensor, a motion sensor, a temporal sensor, a spatial sensor, an illumination sensor, an acceleration sensor, a vibration sensor, a mechanical stress sensor and a shock sensor. That is, the operating environment may include at least one of temperature, humidity, pressure, motion, time, space, illuminance, acceleration, vibration, mechanical stress and shock. However, embodiments of the inventive concept are not limited thereto, and the environmental sensor 150 may further include at least one sensor that collects environment information, such as an external force sensor, a radiation sensor, a dust sensor, an electrical stress sensor, or the like.

The host device 50 may generate the training command in response to the sensing signal SEN, and may transmit the training command to the memory device 100. That is, the computing system 10a may perform the method of FIG. 13.

Referring to FIG. 15, the computing system 10b includes the host device 50 and a plurality of memory devices 100a, 100b and 100c. Otherwise, the computing system 10b may be substantially the same as the computing system 10 of FIG. 3, except that the computing system 10b includes the plurality of memory devices 100a, 100b and 100c. Each of the plurality of memory devices 100a, 100b and 100c may be substantially the same as the memory device 100 in FIG. 3.

In some embodiments, training operations may be performed independently and/or individually on the plurality of memory devices 100a, 100b and 100c, and the optimized DQS/DQ centering may be implemented for each of the plurality of memory devices 100a, 100b and 100c. For example, at least two memory devices may perform the training operations using the same training pattern or different training patterns.

The inventive concept may be applied to various electronic devices and systems that include the system-on-chips and the memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method optimizing DQ calibration patterns for a memory device including data input/output (I/O) pins, the method comprising:
    communicating a training command to the memory device;
    performing a training operation on each of the data I/O pins using a first training pattern having a first condition and a second training pattern having a second condition to generate a training operation result, wherein the first condition is characterized by adjacent data I/O pins among the data I/O pins providing data signals with different phases, and the second condition is characterized by adjacent data I/O pins providing data signals having a same phase; and
    aligning a data strobe signal with data signals provided from the data I/O pins in response the training operation result,
    wherein the different phases are opposite phases.

2. The method of claim 1, wherein the performing of the training operation using the first training pattern occurs during a first time interval, and
    the performing of the training operation using the second training pattern occurs during a second time interval longer than the first time interval.

3. The method of claim 1, wherein the performing of the training operation includes:
performing a first training operation on a first data I/O pin among the data I/O pins using the first training pattern and the second training pattern; and
performing a second training operation on a second data I/O pin among the data I/O pins using a third training pattern having the first condition and a fourth training pattern having the second condition.

4. The method of claim 3, wherein the first training pattern includes first bit sequences provided by the data I/O pins, such that each of the first bit sequences corresponds to a respective one of the data I/O pins, and
a first bit sequence corresponding to the first data I/O pin is different than first bit sequences corresponding to remaining data I/O pins among the data I/O pins other than the first data I/O.

5. The method of claim 4, wherein an inverted bit sequence obtained by inverting the first bit sequence corresponding to the first data I/O pin is equal to the first bit sequences corresponding to the remaining data I/O pins.

6. The method of claim 4, wherein the second training pattern includes second bit sequences providing by the data I/O pins, such that each of the second bit sequences corresponds to a respective one of the data I/O pins, and
the second bit sequences are equal to one another.

7. The method of claim 6, wherein the third training pattern includes third bit sequences provided by the of data I/O pins, such that each of the third bit sequences corresponds to a respective one of the data I/O pins, and
a third bit sequence corresponding to the second data I/O pin is different than third bit sequences corresponding to remaining data I/O pins among data I/O pins other than the second data I/O pin.

8. The method of claim 7, wherein the fourth training pattern includes fourth bit sequences provided by the data I/O pins, such that each of the fourth bit sequences corresponds to a respective one of the data I/O pins, and
the fourth bit sequences are equal to one another.

9. The method of claim 3, wherein the performing of the training operation further includes:
performing a third training operation on a third data I/O pin among the data I/O pins using a fifth training pattern having the first condition and a sixth training pattern having the second condition.

10. The method of claim 3, wherein the aligning of the data strobe signal with data signals provided from the data I/O pins in response the training operation result includes:
obtaining an optimal value as part of the training operation result; and
aligning centers of the data signals with an edge of the data strobe signal in response to the optimal value.

11. The method of claim 1, further comprising:
entering a training mode upon power on of the memory device, wherein the training command is generated in the training mode.

12. The method of claim 1, further comprising:
entering a training mode upon determining that an operating environment for the memory device exceeds a reference range, wherein the training command is generated in the training mode.

13. A computing system comprising:
a first memory device including data input/output (I/O) pins; and
a host device configured to communicate a training command to the first memory device, perform a training operation on each of the data I/O pins using a first training pattern having a first condition and a second training pattern having a second condition to generate a training operation result, and align a data strobe signal with data signals provided by the data I/O pins in response to the training operation result,
wherein the first condition is characterized by adjacent data I/O pins among the data I/O pins providing data signals with different phases, and the second condition is characterized by adjacent data I/O pins providing data signals having a same phase,
wherein the different phases are opposite phases.

14. The computing system of claim 13, wherein the first memory device further includes:
a mode register configured to store the first training pattern and the second training pattern, and
the training operation is performed upon receipt of the training command by loading the first training pattern and the second training pattern, and outputting the first training pattern and the second training pattern through the data I/O pins.

15. The computing system of claim 13, further comprising:
a substrate mounting the first memory device and the host device, and including signal transmission lines,
wherein the data I/O pins are electrically connected to the signal transmission lines, and
an arrangement order for the data I/O pins is different than an arrangement order for the signal transmission lines.

16. The computing system of claim 13, wherein the first memory device includes a volatile memory device operating synchronously with a clock signal provided by the host device.

17. The computing system of claim 13, wherein the host device is a system-on-chip (SoC).

18. The computing system of claim 13, further comprising:
a second memory device different from the first memory device,
wherein a training operation for the second memory device is independent of the training operation on the first memory device.

19. A method optimizing DQ calibration patterns for a memory device including data input/output (I/O) pins and a data strobe pin, the method comprising:
entering a training mode upon power on of the memory device;
generating a training command in the training mode;
communicating the training command to the memory device;
performing a first training operation on a first data I/O pin among the data I/O pins using a first training pattern having a first condition and a second training pattern having a second condition to generate a first training operation result;
performing a second training operation on a second data I/O pin among the data I/O pins using a third training pattern having the first condition and a fourth training pattern having the second condition to generate a second training operation result;
obtaining an optimal value based on the first training operation result and the second training operation result; and
aligning centers data signals provided by the I/O data pins with an edge of a data strobe signal provided by the data strobe pin in response to the optimal value,
wherein the first condition is characterized by adjacent data I/O pins among the data I/O pins providing data signals with different phases, and the second condition is characterized by adjacent data I/O pins providing data signals having a same phase, the first training pattern includes first bit sequences provided by the data I/O pins, such that each of the first bit sequences corresponds to a respective one of the data I/O pins, a first bit sequence corresponding to the first data I/O pin is different from first bit sequences corresponding to remaining data I/O pins among the data I/O ping, other than the first data I/O pin, the second training pattern includes second bit sequences provided by the data I/O pins, such that each of the second bit sequences corresponds to a respective one of the data I/O pins, and the second bit sequences are equal to one another.

* * * * *